(12) United States Patent
Huber et al.

(10) Patent No.: US 9,980,385 B2
(45) Date of Patent: May 22, 2018

(54) DISCRETE ELECTRONIC DEVICE EMBEDDED IN CHIP MODULE

(71) Applicant: INTERNATIONAL BUSINESS MACHINES CORPORATION, Armonk, NY (US)

(72) Inventors: Andreas Huber, Leonberg (DE); Harald Huels, Horb am Neckar (DE); Stefano S. Oggioni, Besana in Brianza (IT); Thomas Strach, Wildberg (DE); Thomas-Michael Winkel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/494,672

(22) Filed: Apr. 24, 2017

(65) Prior Publication Data
US 2018/0027659 A1 Jan. 25, 2018

Related U.S. Application Data

(63) Continuation of application No. 15/214,565, filed on Jul. 20, 2016, now Pat. No. 9,673,179.

(51) Int. Cl.
*H05K 1/18* (2006.01)
*H05K 1/14* (2006.01)
(Continued)

(52) U.S. Cl.
CPC .......... *H05K 1/183* (2013.01); *H05K 1/0219* (2013.01); *H05K 1/115* (2013.01); *H05K 1/144* (2013.01);
(Continued)

(58) Field of Classification Search
CPC .......... H01L 25/0657; H01L 23/49838; H01L 2225/06537; H01L 2225/06548;
(Continued)

(56) References Cited

U.S. PATENT DOCUMENTS 3,264,525 A * 8/1966 Swengel .............. H01R 13/514
361/733
4,845,452 A 7/1989 Sasaki et al.
(Continued)

FOREIGN PATENT DOCUMENTS

JP 2012134523 A 7/2012

OTHER PUBLICATIONS

Alam et al., "Effectiveness of embedded capacitors in reducing the number of surface mount capacitors for decoupling applications", Emerald / Insight, Online from: 1974, Accessed on Mar. 14, 2016, 3 pages, Abstract.

(Continued)

*Primary Examiner* — Scott B Geyer
(74) *Attorney, Agent, or Firm* — Michael O'Keefe

(57) ABSTRACT

The invention relates to a method for embedding a discrete electronic device in a chip module. The chip module comprises a multilayer substrate which comprises a plurality of electrically conductive layers stacked above each other and an electrically non-conductive layer arranged between each pair of electrically conductive layers. The chip module is configured to receive one or more chips to be mounted onto a top surface thereof. Each electrically conductive layer comprises one or more electrically conductive structures. A recess is provided in a side surface of the chip module. The discrete electronic device is inserted into the recess. A first electrically conductive connection between a first electrical contact of the discrete electronic device and a first electrically conductive structure is established. Further, a second
(Continued)

electrically conductive connection between a second electrical contact of the discrete electronic device and a second electrically conductive structure is established.

20 Claims, 18 Drawing Sheets

(51) Int. Cl.
*H05K 3/46* (2006.01)
*H05K 3/18* (2006.01)
*H05K 3/00* (2006.01)
*H05K 1/11* (2006.01)
*H05K 3/34* (2006.01)
*H05K 1/02* (2006.01)

(52) U.S. Cl.
CPC .......... *H05K 1/181* (2013.01); *H05K 3/0097* (2013.01); *H05K 3/18* (2013.01); *H05K 3/34* (2013.01); *H05K 3/4697* (2013.01); *H05K 2201/049* (2013.01); *H05K 2201/10015* (2013.01); *H05K 2201/10106* (2013.01)

(58) Field of Classification Search
CPC .......... H01L 2225/06551; H01L 2224/09179; H05K 1/182; H05K 1/183
See application file for complete search history.

(56) References Cited

U.S. PATENT DOCUMENTS

| | | |
|---|---|---|
| 5,774,028 A | 6/1998 | Kim |
| 6,437,252 B2 | 8/2002 | Rehm et al. |
| 6,928,726 B2 | 8/2005 | Zollo et al. |
| 7,216,422 B2 | 5/2007 | Fan et al. |
| 7,286,366 B2 | 10/2007 | Zollo et al. |
| 7,312,402 B2 | 12/2007 | Antu et al. |
| 8,832,931 B2 | 9/2014 | Thompson et al. |
| 2004/0157410 A1 | 8/2004 | Yamaguchi |
| 2005/0098346 A1 | 5/2005 | Fan et al. |
| 2016/0219712 A1 | 7/2016 | Ko et al. |

OTHER PUBLICATIONS

Seidel et al., "Ultra-thin high density capacitors for advanced packaging solutions", EMPC 2015, European Microelectronics Packaging Conference, Sep. 2015, Friedrichshafen, Germany, Abstract, 6 pages.

IBM: List of IBM Patents or Patent Applications Treated as Related (Appendix P), Apr. 26, 2017 pp. 1-2.

Huber, et al., Pending U.S. Appl. No. 15/214,565, filed Jul. 20, 2016, titled "Discrete Electronic Device Embedded in Chip Module", pp. 1-67.

* cited by examiner

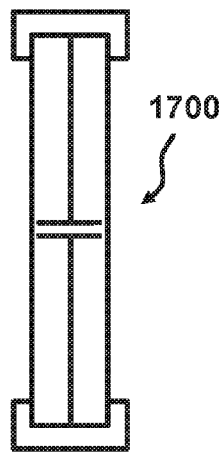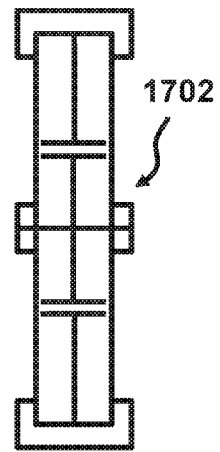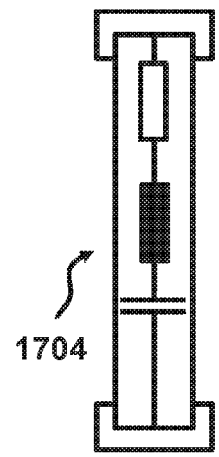
Figure 17A  Figure 17B  Figure 17C
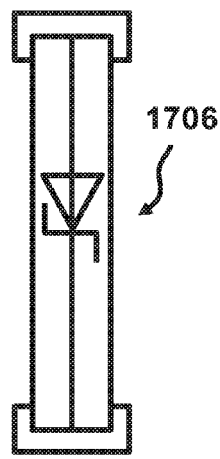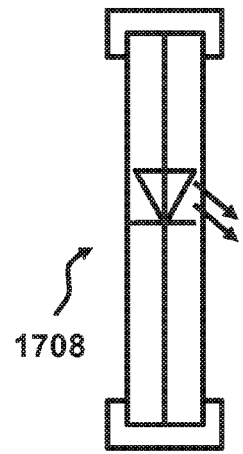
Figure 17D  Figure 17E

DISCRETE ELECTRONIC DEVICE EMBEDDED IN CHIP MODULE

BACKGROUND

The present disclosure describes a method for embedding a discrete electronic device in a chip module and in particular a method for embedding a discrete electronic device laterally into a side wall of a discrete electronic device. The disclosure further describes a chip module with a discrete electronic device embedded therein.

In the field of microelectronics, one of the challenges of modern microelectronic system development is the requirement to reduce the dimensions of the systems in order to provide smaller systems and, at the same time, maintain or even improve the performance of the systems. In order to meet this challenge, there is a growing interest to use embedded electronic devices.

Discrete electronic devices such as decoupling capacitors are usually placed on top of a chip module such as single chip module (SCM) or multi chip module (MCM). This placement provides a low resistive contact to a voltage layer within the chip module as well as chip(s) mounted on top of the chip module. However, the available space for mounting discrete electronic devices on top of a chip module is limited due to the fact a significant part of the respective space is required for mounting the chip(s).

SUMMARY

Embodiments of the present invention provide for an improved method for embedding a discrete electronic device in a chip module, an improved chip module with a discrete electronic device embedded therein as well as an as a chip module and a panel for manufacturing an improved chip module with a discrete electronic device embedded therein as specified in the independent claims. Embodiments of the invention are given in the dependent claims. Embodiments of the present invention can be freely combined with each other if they are not mutually exclusive.

According to an embodiment of the present invention, a method for embedding a discrete electronic device in a chip module is provided. The chip module includes a multilayer substrate with a horizontal top surface, a horizontal bottom surface and at least one vertical side surface extending peripherally between the top surface and the bottom surface, the chip module is configured to receive one or more chips to be mounted onto the top surface, and the chip module further is configured to be mounted on a printed circuit board.

Furthermore, the chip module includes a plurality of horizontal sections stacked above each other between the top surface and the bottom surface. Each section includes a lower and an upper horizontal electrically conductive layer. Each section further includes a horizontal electrically non-conductive layer arranged between the lower and the upper electrically conductive layer. Each electrically conductive layer includes one or more electrically conductive structures. The discrete electronic device includes a first and a second electrical contact spaced apart from each other.

The method for embedding a discrete electronic device in a chip module includes providing a recess in a side surface, the recess extends vertically within a plurality of sections, inserting the discrete electronic device into the recess, the discrete electronic device extends within a plurality of sections, establishing a first electrically conductive connection between the first electrical contact and a first electrically conductive structure, establishing a second electrically conductive connection between the second electrical contact and a second electrically conductive structure.

According to an embodiment of the present invention, a chip module structure is provided. The chip module structure includes at least a multilayer substrate with a horizontal top surface and a horizontal bottom surface, the multilayer substrate includes a plurality of horizontal sections stacked above each other between the top surface and the bottom surface, each section may include a lower and an upper horizontal electrically conductive layer as well as a horizontal electrically non-conductive layer arranged between the lower and the upper electrically conductive layer, the sections may be separated from each other by horizontal electrically non-conductive layers, and the respective layers of the multilayer substrate may include thin-film as well as thick-film layers. According to an embodiment of the present invention, the composition of the substrate may be symmetric with respect to an imaginary horizontal plane located in the middle between the top and bottom surface. According to an embodiment of the present invention, the multilayer substrate may include a plurality of thick-film layers at the center of the stack and a plurality of thin-film layer arranged between the thick-film layers and the top-surface as well as between the between the thick-film layers and the bottom surface. Each electrically conductive layer may include one or more electrically conductive structures.

According to an embodiment of the present invention, an electrically conductive layer structure is provided. The electrically conductive layer structure may be configured as a continuously electrically conductive layer, i.e. as a single discrete electrically conductive structure covering the entire layer or it may include one or more discrete electrically conductive structures, none of which covers the entire layer. The electrically conductive structures may be provided with different levels of voltage. For example, an electrically conductive layer may be split into two or more discrete electrically conductive structures each provided with a different level of voltage. A first structure of the same layer may for example be ground (GND) while a second structure is provided with a level of voltage different from ground. According to an embodiment of the present invention, an electrically conductive layer may include a signal line to which an electrically conductive connection of one of the first and second electrical contact is established. According to an embodiment of the present invention, the electrically conductive layer with the signal line may in addition include additional structure providing GND.

A chip module may be provided in the form of an organic or ceramic single or multi chip module. According to an embodiment of the present invention, a chip module may be provided in the form of a silicon interposer.

A chip is an integrated circuit, i.e. a circuit in which all or some of the circuit elements are inseparably associated and electrically interconnected so that it is considered to be indivisible for the purposes of construction and commerce. A chip may also be referred to as integrated circuit, monolithic integrated circuit, IC or microchip. It may include a set of electronic circuits on a small plate of semiconductor material, e.g. silicon.

Vias may be blind vias exposed only on a top or bottom surface of the chip module or may be buried vias connecting internal layers without being exposed on either surface. Thus a via in the form of a blind hole, i.e. a blind via, may connect an electrically conductive structure in an internal layer to an surface of the chip module, thus providing an external access to the electrically conductive structure of the internal layer.

The electrically conductive structure may, for example, be provided by an electrically conductive layer of the chip module, i.e. the internal layer may be an electrically conductive layer, or by an electrically conductive structure, such as another via, vertically extending through the internal layer, the internal layer being a non-conductive layer. A non-conductive layer includes no electrically conductive structures extending horizontally in layer providing a horizontal electrically conductive connection within the layer.

Adjacent electrically conductive thin-film layers of the same voltage level may be connected by micro-vias. Micro-vias may be blind vias or buried vias with a diameter equal to or less than 150 μm, e.g. 90 μm to 60 μm. Micro-vias may not be stacked, but rather provided with an offset. Thus, no continuous vias extending through a plurality of layers may be provided.

A plurality of thick-film layers may include vias extending throughout all of the respective thick film layers. For example, the chip module may include a central stack of thick-film layers with vias extending through the entire stack.

According to an embodiment of the present invention, a chip module may be configured to receive one or more chips to be mounted onto a top surface, while the chip module may further be configured to be mounted on a printed circuit board (PCB). Thus, a chip module may mechanically support and electrically connect one or more chips with a PCB using conductive tracks, pads and other features e.g. etched from copper sheets laminated onto an electrically non-conductive substrate. The chip module may provide a plurality of connections, e.g. in the form of connection pads, within one or more chip areas on its top surface. The size of the connections as well as the spacing between them may be adjusted to the size and spacing of the connections of the chips to be mounted onto the chip module. For mounting the chips e.g. the flip chip method, otherwise known as a controlled collapse chip connection or C4, may be used. A bottom surface of the chip module may include a plurality of connections as well, applied thereon e.g. by backside metallization (BSM). The size of the respective connections as well as the spacing between them may be adjusted to the size and spacing of the connections of the PCB onto which the chip module is to be mounted.

Printed circuit board with chip modules according to the present invention mounted thereon may, for example, be used in mainframes, servers, workstations, PC's, or mobile devices, such as laptops, tablets, or smartphones, as well as other complex electronic devices.

According to an embodiment of the present invention, a method may be provided to insert and solder discrete electronic devices such as a surface mount (SMT) capacitor in a partially copper plated lateral recess of a chip module. The recess may be provided in the form of slots, for example vertical slots or horizontal slots, in particular in the form of elongated rectangular slots that are milled into side walls of the chip module.

Embodiments of the present invention may have an advantage that an efficient electrically conductive contact to arbitrary voltage and GND layers in the SCM or MCM stack-up may be provided, having a low resistive and inductive path to the chip. Using state of the art SMT capacitors, a high total capacity may be available for voltage stabilization.

Embodiments of the present invention may allow providing a large number of capacitors to a chip module such as an SCM, with the capacitors each having a low resistive and inductive connection to an arbitrary voltage and GND layer of the SCM.

The electrically conductive layers of the chip module design may be prepared in an area where the recess will be provided into a sidewall of the chip module in order to provide a predefined electrically non-conductive portion. The electrically conductive structures included by electrically conductive layers which are not intended to be connected to the discrete electronic device to be embedded are provided with a clearance around a boundary of a predefined portion.

A recess may be provided in the side surface of the chip module, e.g. by milling, drilling and/or laser cutting. By selecting a wavelength of the laser as well as the adjusting a power of the laser depending on a type of material, a cutting depth of the laser may effectively be controlled. Furthermore, a structure, e.g. copper structures, may be implanted into the substrate in order to limit the cutting depth of the laser. The recess may be cleaned. After cleaning, electrically conductive plating, e.g. copper plating, may be provided on select areas of inner surfaces of the recess. The electrically conductive plating may ensure a good electrical contact between the discrete electronic device and internal electronic layers of the chip module such as the voltage and GND layers. In addition, the electrically conductive plated areas may serve as an EMC (electromagnetic compatibility) fence providing a shielding against electromagnetic interferences (EMI).

According to an embodiment, the recess may be provided in the form of an elongated rectangular slot. Embodiments may have an advantage such that a recess is provided matching a form of the discrete electronic device, e.g. a standardized a block-shaped rectangular SMT component.

In an assembly step, the discrete electronic device may be placed inside the recess and fixed in place, e.g. with a glue dot. The discrete electronic device may further be soldered in order to ensure an efficient electrically conductive coupling exists between the electrical contacts of the respective electronic device and the electrically conductive plating. According to an embodiment, all discrete electronic devices may be soldered simultaneously, e.g. using hot gas soldering.

According to an embodiment, the discrete electronic devices may be placed in an elongated recess extending horizontally, e.g. in the top or bottom layers of the of the chip module.

Interference with surface mount components may be avoided. According to an example, e.g. up to 160 capacitors with up to 10 μF each, may be peripherally distributed around a chip module in the form of a SCM. Efficient and direct connections to power and/or GND layers of the chip module are provided. A peripheral EMC shielding may be provided around the chip module. The discrete electronic devices may be provided in the form of standard SMT devices. For example, standard SMT capacitors may be used instead of e.g. expensive inter-digitated capacitors (IDCs). According to an embodiment, the recess may include an opening within the side surface as well as the top and/or bottom surface. According to an embodiment, the method may have an advantage to enable reparability, and adaptability of the discrete electronic devices placed within the recesses, as well as access for checking functionality of the respective electronic device. Furthermore, a recess with a lateral opening in the side surface of the chip module may provide an advantageous distribution of thermal radiation. In contrary to a buried device, where all thermal radiation may be transmitted directly into the chip module, a device embedded in a recess with a large lateral opening may radiate a large portion of thermal radiation away from the chip module. According to an embodiment, a recess according may be easy to manufacture, e.g. by milling vertical slots into a sidewall of the chip module. The location of the embedded discrete electronic devices may be easy to detect.

SCMs as well as MCMs are typically designed using a homogenous pattern for bottom-side metallization (BSM).

The electrically conductive plating may provide efficient connections to power layers and/or GND.

According to an embodiment, an elongated recess is provided which extend along an edge of the top or bottom surface of the chip module. The respective recess may include a continuous opening which extends within the side surface as well as the top or bottom surface. According to an embodiment, the discrete electronic devices may be inserted horizontally, i.e. such that a longitudinal axis of the electronic device is aligned parallel to an edge of the chip module.

According to an embodiment, the recesses may extend within a plurality of thin film layers at a top or bottom of the chip module. An embodiment may have the advantage that electrically conductive layers of the respective plurality of thin film layers may be connected to contacts, where the contacts may be connected to the same discrete electronic device. Locating the discrete electronic device adjacent to the top of the chip module may facilitate the accessibility of the respective device, even in case the chip module is mounted on a PCB.

According to an embodiment, the recess may extend throughout a total height of the chip module. An embodiment may have an advantage where a discrete electronic device may be inserted into the recess such that a first electrical contact of the respective device is connected to a first electrically conductive structure of an electrically conductive layer which is part of a set of thin-film layers arranged above a center plane of the chip module. A second electrical contact of the respective device may be connected to a second electrically conductive structure of an electrically conductive layer which is part of a second set of plurality of thin-film layers arranged below a center plane of the chip module.

According to an embodiment, additional steps may be required for the physical design, manufacturing, and electrical design of the chip module. When designing the electrically conductive structures of the electrically conductive layers, clearances may be added to those structures which are not intended to be connected to a specific discrete electronic device. Further, additional GND micro-vias may be added for discrete electronic devices, e.g. capacitors, to improve the loop inductance.

According to an embodiment, the method may include the following steps of the physical design, manufacturing, and electrical design:

| | Work steps |
|---|---|
| Physical Design | Add clearances to electrically conductive structures that should not be connected to embedded electronic devices |
| Manufacturing | Providing recesses (e.g. milling/laser cutting) into chip module |
| | Add copper plating |
| Electrical Design | Optimize loop inductance |

In an example, a loop may be included in a path between a decoupling capacitor and the device, e.g. a chip of the chip module, which may draw charge from the decoupling capacitor. Further, the loop may be configured to begin at the decoupling capacitor, continue through a via to one of the power layers, continue from one power plane to another and finally end at the decoupling capacitor through a via.

According to an embodiment, the method may further include: providing a plurality of recesses peripherally distributed around the chip module in one or more side surfaces of the chip module, and adding a first and a second electrically conductive plating to each recess such that the electrically conductive plated recesses form a fence peripherally arranged around the chip module. According to an embodiment, a closed fence is formed. The fence may provide a shielding against emission of electromagnetic energy by the chip module. The larger the surface area covered by each plating, the larger the EMI shielding provided by the plating may be.

In a further embodiment, the invention relates to a chip module with a discrete electronic device embedded therein. The chip module includes: a multilayer substrate with a horizontal top surface, a horizontal bottom surface and at least one vertical side surface extending peripherally between the top surface and the bottom surface, the chip module is configured to receive one or more chips to be mounted onto the top surface, the chip module further is configured to be mounted on a printed circuit board, a plurality of horizontal sections stacked above each other between the top surface and the bottom surface, each section includes a lower and an upper horizontal electrically conductive layer, each section further includes a horizontal electrically non-conductive layer arranged between the lower and the upper electrically conductive layer, each electrically conductive layer includes one or more electrically conductive structures; the discrete electronic device includes a first and a second electrical contact spaced apart from each other, a recess in the side surface, the recess extends vertically within a plurality of sections, the discrete electronic device is located in the recess, the discrete electronic device extends within a plurality of sections, a first electrically conductive connection between the first electrical contact and a first electrically conductive structure, a second electrically conductive connection between the second electrical contact and a second electrically conductive structure.

An embodiment may have an advantage that a chip module is provided with one or more discrete electronic device embedded therein. The discrete electronic devices are embedded in a space saving way such that the functionality of chips mounted onto the chip module is not disturbed. Furthermore, the discrete electronic devices are easily detectable, accessible and efficiently connected to electrically conductive layers of the chip module. Furthermore, the recess provides protection for the discrete electronic device embedded therein against external forces.

In a further embodiment, the invention relates to a method for embedding a discrete electronic device in a chip module. The chip module includes a multilayer substrate with a horizontal top surface, a horizontal bottom surface and at least one vertical side surface extending peripherally between the top surface and the bottom surface. The chip module is configured to receive one or more chips to be mounted onto the top surface. The chip module further is configured to be mounted on a printed circuit board. The chip module further includes a plurality of horizontal electrically conductive layers with adjacent electrically conductive layer being separated from each other by a horizontal electrically non-conductive layer. The chip module further includes a predefined electrically non-conductive portion for embedding a discrete electronic device. The predefined portion is located at the side surface and extending vertically through a plurality of electrically conductive layers. The discrete electronic device including a first and a second electrical contact spaced apart from each other.

The method includes providing two trenches at least in the top or bottom surface extending from the side surface along a circumferential boundary of the predefined portion into the respective top or bottom surface, such that a linking portion remains between the two trenches connecting the predefined portion with the rest of the substrate, applying a first plating to the surfaces of an outer sidewall of the first trench, applying a second plating to the surfaces of an outer sidewall of the second trench, removing the linking portion; removing the remaining part of the predefined portion extending between the two trenches such that a recess for receiving the discrete electronic device is provided in the side surface, the recess extends along a peripheral edge of the top surface; inserting the discrete electronic device into the recess, establishing a first electrically conductive connection between the first electrical contact and a first electrically conductive structure via a first plating, establishing a second electrically conductive connection between the second electrical contact and a second electrically conductive structure via a second plating.

Embodiments may have the advantage that they provide an efficient method for embedding a discrete electronic device in a chip module. Furthermore, they allow establishing conductive connection between the discrete electronic device and electrically conductive structures of thin-film layers and even to electrically conductive structures of the same layer.

In a further embodiment, the invention relates to a chip module configured for embedding a plurality of discrete electronic devices therein. The discrete electronic devices are peripherally distributed around the chip module. The chip module includes a multilayer substrate with a horizontal top surface, a horizontal bottom surface and one or more vertical side surfaces extending peripherally between the top surface and the bottom surface, the chip module is configured to receive one or more chips to be mounted onto the top surface, the chip module further is configured to be mounted on a printed circuit board, a plurality of horizontal electrically conductive layers with adjacent electrically conductive layer being separated from each other by a horizontal electrically non-conductive layer, a plurality of predefined electrically non-conductive portions for embedding a discrete electronic device.

Each of the predefined portions are located at one of the side surfaces and extending vertically through a plurality of electrically conductive layers. The predefined portions are peripherally distributed around the chip module. For each predefined portion, a first one of the electrically conductive layers includes an electrically non-conductive clearance along a first part of a circumferential boundary of the respective predefined portion and an electrically conductive structure reaching to a second part of the circumferential boundary of the respective predefined portion. For each predefined portion, a second one of the electrically conductive layers includes an electrically non-conductive clearance along the second part of the circumferential boundary of the respective predefined portion and an electrically conductive structure reaching to the first part of the circumferential boundary of the respective predefined portion. The size of each predefined portion is configured to be provided with a recess for receiving a discrete electronic device including a first and a second electrical contact spaced apart from each other, such that a first electrically conductive connection is established between the first electrical contact and the electrically conductive structure of the first electrically conductive layer, and such that a second electrically conductive connection is established between the second electrical contact and the electrically conductive structure of the second electrically conductive layer.

An embodiment may have an advantage that they provide a chip module which may allow embedding discrete electronic devices efficiently, such that they are easily detectable, accessible, efficiently connected to electrically conductive layers of the chip module and protected against external forces by the recesses in which they are embedded.

In a further embodiment, the invention relates to a multilayer substrate panel for manufacturing a plurality of chip modules with a plurality of discrete electronic devices embedded therein. The discrete electronic devices are peripherally distributed around each one of the chip modules. The panel includes a plurality of chip modules. Each chip module includes a part of the multilayer substrate panel with a horizontal top surface, a horizontal bottom surface, and one or more vertical side surfaces extending peripherally between the top surface and the bottom surface; the chip module is configured to receive one or more chips to be mounted onto the top surface; the chip module further is configured to be mounted on a printed circuit board, a plurality of horizontal electrically conductive layers with adjacent electrically conductive layer is separated from each other by a horizontal electrically non-conductive layer; a plurality of predefined electrically non-conductive portions for embedding a discrete electronic device.

Each of the predefined portions is located at one of the side surfaces and extending vertically through a plurality of electrically conductive layers. The predefined portions are peripherally distributed around the chip module. For each predefined portion a first one of the electrically conductive layers includes an electrically non-conductive clearance along a first part of a circumferential boundary of the respective predefined portion and an electrically conductive structure reaching to a second part of the circumferential boundary of the respective predefined portion. For each predefined portion a second one of the electrically conductive layers includes an electrically non-conductive clearance along the second part of the circumferential boundary of the respective predefined portion and an electrically conductive structure reaching to the first part of the circumferential boundary of the respective predefined portion, the size of each predefined portion is configured to be provided with a recess for receiving a discrete electronic device including a first and a second electrical contact spaced apart from each other such that a first electrically conductive connection is established between the first electrical contact and the electrically conductive structure of the first electrically conductive layer and such that a second electrically conductive connection is established between the second electrical contact and the electrically conductive structure of the second electrically conductive layer.

An embodiment may have the advantage that they provide a multilayer substrate panel which may be used to manufacture a plurality of chip modules and efficiently embed discrete electronic devices therein, such that they are easily detectable, accessible, efficiently connected to electrically conductive layers of the chip module and protected against external forces by the recesses in which they are embedded.

By using a multilayer substrate panel, a plurality of chip modules may be manufactured in parallel.

BRIEF DESCRIPTION OF THE DRAWINGS

The following detailed description, given by way of example and not intended to limit the invention solely thereto, will best be appreciated in conjunction with the accompanying drawings, in which:

FIG. 17A to 17E depict schematics of cross-sections of exemplary discrete electronic devices to be embedded in chip modules using the present method.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
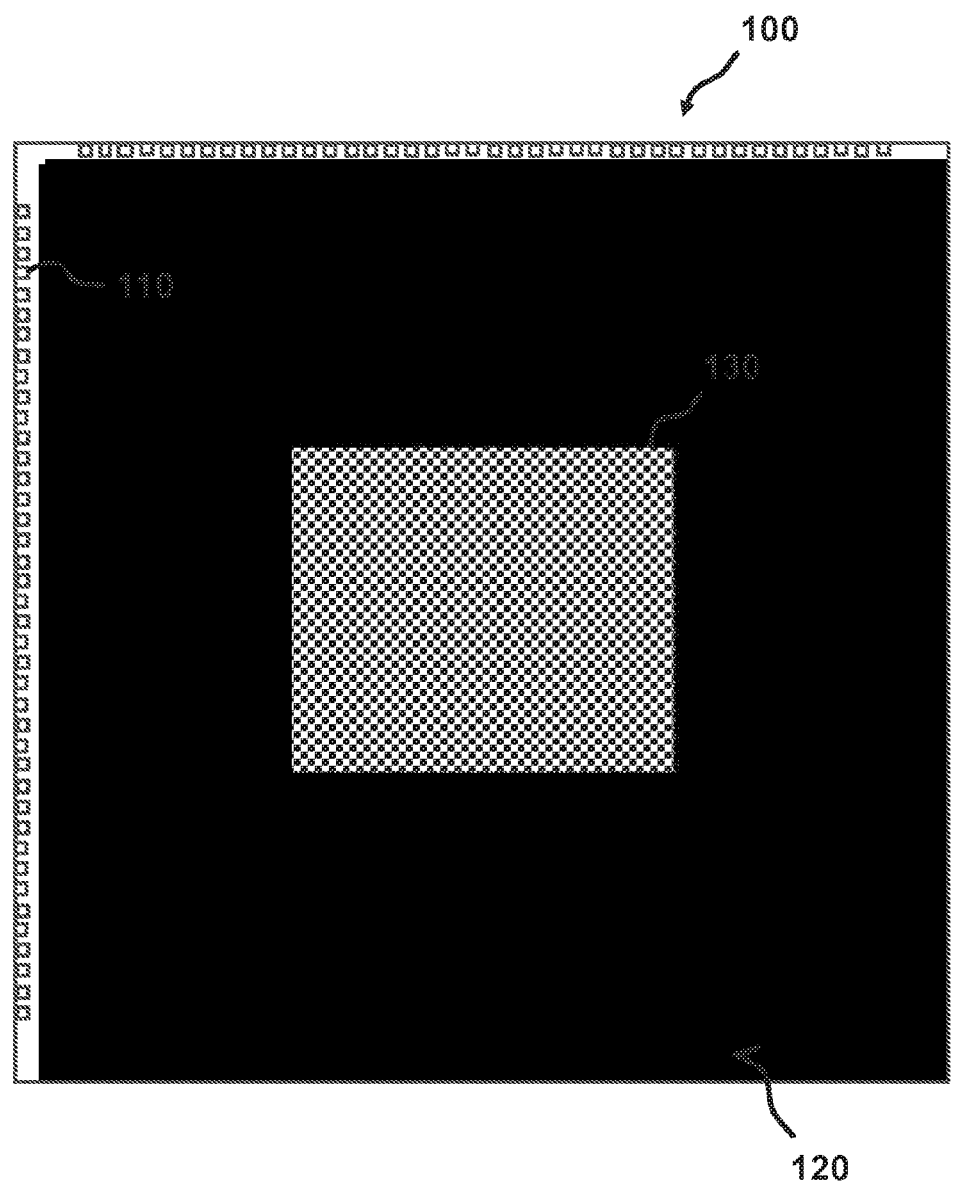
FIGS. 1A and 1B depict a schematic of a view of a top surface of an exemplary chip module provided with predefined lateral portions for embedding of discrete electronic devices.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

In an embodiment according to the present invention, an exemplary embedded electronic device may be a capacitor, in particular a surface mount technology (SMT) capacitor, vertically or horizontally inserted in a multilayer stack-up, as well as a resistor, an inductor, a filter or a diode like e.g. a Zener diode. All the aforementioned electronic devices may, for example, be used in the form of standard SMT components. Furthermore, the discrete electronic device may e.g. be provided in the form of an LED.

Surface mount technology is a method for producing electronic circuits in which the components, for example, surface mount components, are mounted or placed directly onto a surface of a printed circuit board. Generally, standardized components are used in surface mount technology. An electronic device made as such is called a surface mount device (SMD).

Electrical systems voltage stabilization is critical in a computer system. The reduction of power noise is a requirement in a computer system as well as in other digital circuits. Decoupling capacitors may be used for reducing power noise.

Decoupling capacitors providing an effective way to reduce the impedance of power delivery systems operating at high frequencies and may be used to manage power supply noise. A decoupling capacitor acts as a local reservoir of charge, which is released when the power supply voltage at a particular current load drops below a predefined level. Due to an inductance of the capacitor with slow scaling, a location of the decoupling capacitor may significantly affect a design of power/ground networks in high performance integrated circuits such as microprocessors. At higher frequencies, a distributed system of decoupling capacitors may need to be placed on-chip to effectively manage the power supply noise.

According to an embodiment, an electrically conductive connection may be establishing by using a conductive solder paste inserted into recesses at a first and second contact of a discrete electronic device. The method further includes soldering with the inserted solder paste.

The solder paste may include a powder metal solder suspended in a flux. Solder composition may include a tin-lead alloy with possibly a third metal alloy. The solder composition may be tin-lead (like e.g. Sn63Pb37), tin-silver-copper (SAC) alloys (e.g. Sn96.5Ag3Cu0.5) or tin-antimony (e.g. Sn95Sb5). The flux may e.g. include ammonium chloride or rosin for soldering tin.

This may have the advantage that an efficient electrically conductive connection is created. Furthermore, the device is fixed in place due to the soldering. The soldering may be performed using for example hot gas, laser or infrared radiation.

In an alternative embodiment, a conductive fill material may be used without soldering which may create an electrical conductive connection. For example, an epoxy matrix filled with conductive particles, for example, copper particles, silver particles and/or silver coated copper, particles may be applied which provides electrical (and thermal) conductivity in a cured state.

According to an embodiment, the first and second electrically conductive structures may be part of the same electrically conductive layer. According to an embodiment, the first electrically conductive structure is part of a first electrically conductive layer of a first one of the plurality of sections, between which the discrete electronic device extends. The second electrically conductive structure is part of a second electrically conductive layer of a second one of the plurality of sections between which the discrete electronic device extends.

According to an embodiment, the recess may include an elongated form extending along a first longitudinal axis. The first longitudinal axis extends along the side surface. The discrete electronic device may include an elongated form extending along a second longitudinal axis. The discrete electronic device may be inserted into the recess, such that the second longitudinal axis extends parallel to the first longitudinal axis.

This embodiment may have the advantage that the discrete electronic device may extend parallel to the side surface, such that is easily accessible. In particular the electrical contacts of the discrete electronic device may be easily accessible. Furthermore, the discrete electronic device may not extend deeply into chip module in a direction perpendicular to the side surface. Thus, the discrete electronic device may be prevented from negatively affecting the functionality of a chip mounted on the chip module, e.g. by blocking areas of the chip module intended to be used to connect the respective chip with a PCB.

According to an embodiment, the first longitudinal axis extends vertically along the side surface. Thus, the first longitudinal axis may extend perpendicularly to the top and/or bottom surface as well as the layers of the multilayer substrate. This embodiment may have an advantage that they enable establishing connections between the discrete electronic device and thin-film layer located next to each other.

According to an embodiment, the first longitudinal axis extends horizontally along the side surface. Thus, the first longitudinal axis may extend parallel to the top and/or bottom surface as well as the layers of the multilayer substrate. This embodiment may have an advantage that they enable establishing connections between the discrete electronic device and an electrically conductive layer which is located at the top of the chip module as well as an electrically conductive layer which is located at the bottom of the chip module.

According to an embodiment, the recess extends at least into the top surface or at least into the bottom surface.

According to an embodiment, the longitudinal discrete electronic device includes a first and a second end. The first electrical contact is located at the first end and the second electrical contact being located at the second end. This embodiment may have the advantage that they easily inserting and accessing the discrete electronic device from the top as well as from the bottom of the chip module.

According to an embodiment, the method further includes adding a first and a second electrically conductive plating spaced apart from each other onto an inner surface of the recess such that the first plating provides an electrically conductive connection for the first electrical contact at least to the first electrically conductive structure, and the second plating provides an electrically conductive connection for the second electrical contact at least to the second electrically conductive structure.

This embodiments may have the advantage that they provide an efficient electrically conductive connection between the discrete electronic device and the edge of the electrically conductive structures exposed by providing the recess in the chip module. Furthermore, the plating may provide an EMI shielding.

According to an embodiment, the first and the second electrically conductive plating each extends vertically over a plurality of sections. The first plating provides electrically conductive connections for the first electrical contact to a first set of electrically conductive layers and the second plating providing electrically conductive connections for the second electrical contact to a second set of electrically conductive layers.

This embodiments may have the advantage that they provide an efficient electrically conductive connection between the discrete electronic device and the edges of a set of electrically conductive structures exposed by providing the recess in the chip module. The electrically conductive structures of each set may be provided with the same level of voltage.

According to an embodiment, the first electrically conductive plating fully covers a first portion of the inner surface of the recess which the first electrical contact is facing, when being located at a predefined position within the recess. The second electrically conductive plating fully covers a second portion of the inner surface of the recess which the second electrical contact is facing, when being located at a predefined position within the recess.

According to an embodiment, the first and the second electrically conductive plating may be provided in the form of a first and a second band extending parallel above each other. Each one of the two bands may further extend from a first edge portion of the recess to an opposite second edge of the recesses along an electrically conductive layer including the electrically conductive structure to which the respective plating is to be connected.

According to an embodiment, at least one of the first and second electrically conductive structures may include a discrete electrically conductive path. This embodiments may have the advantage that they provide an efficient electrically conductive connection between the discrete electronic device and discrete electrically conductive path like a signal line.

This may further have the advantage that the electronic device may provide a serial capacitor in a signal path in a chip module. The discrete electrically conductive path may e.g. be a wire extending horizontally on or within a non-conductive material. The electrically conductive layer may include a plurality of discrete electrically conductive paths.

According to an example, at least one of the first and second electrically conductive structures is configured as a continuously electrically conductive layer.

This may have the advantage that the different conductive layers may provide different continuous voltage levels. In an embodiment each section includes an electrically conductive layer being grounded, i.e. a grounded layer, and an electrically conductive layer establishing a non-zero voltage level, i.e. a power layer.

According to an embodiment, the recess is provided in a predefined portion of the chip module. The predefined portion extends vertically through a plurality of electrically conductive layers. Each one of the respective electrically conductive layers which is not intended to be provided with an electrically conductive connection to the discrete electronic device includes a clearance filled with an electrically non-conductive fill material, such that the respective clearance provides an insulation between the respective layer and the recess provided at the predefined portion.

The electrically non-conductive fill material may be a non-conductive epoxy paste.

According to an embodiment, the chip module includes a plurality of vertical ground vias distributed peripherally around the predefined location. According to an embodiment, vertical ground vias may be distributed such that a connection is provided with one or more GND structures located next to a first electrically conductive structure and a second electrically conductive structure. The first electrically conductive structure may provide a power level different from GND like a signal line and be intended to be connected to a first electrical contact of a discrete electronic device, while the second electrically conductive structure is a GND structure. The vias may be distributed peripherally around the predefined location between different layers with a horizontal offset between vias at different vertical levels.

According to an embodiment, the method further includes providing at least two spaced apart recesses located vertically above each other. The upper one of the respective recesses extending into the top surface. The lower one of the respective recesses extending into the bottom surface. This embodiments may have the advantage that a plurality of distinct electronic devices may be provided in a space-saving way at different vertical levels.

According to an embodiment, the discrete electronic device includes a third electrical contact arranged between the first and second electrical contact. The method further includes adding a third electrically conductive plating spaced apart from the first and the second electrically conductive plating onto an inner surface of the recess, and establishing a third electrically conductive connection between the third electrical contact and a third electrically conductive structure via the third plating. The third electrically conductive structure is arranged between the first and second electrically conductive structure.

According to an example, the third electrically conductive layer is grounded. This may have the advantage that it allows for integrating two capacitors within one electronic device. The third electrical contact may be connected with a grounded conductive layer, while the first and the second contact may be contacted with conductive layers of different sections establishing different or identical voltage levels. Thus the grounded conductive layer is used for both capacitors.

According to an example, the third electrically conductive layer is connected to voltage while the two other conductive layers are grounded. This may have the advantage that it allows for integrating two capacitors connected to one voltage in parallel within one electronic device.

According to an embodiment, the discrete electronic device is a capacitor, a resistor, an inductor, a filter or an active component. This may allow for a broad variety of usages of the present invention. An active component may for example be a Z-diode, i.e. a Zener diode allowing current to flow in the forward direction in the same manner as an ideal diode, but permitting the current to flow in the reverse direction when the voltage is above a certain value known as the breakdown voltage. In an example, the discrete electronic device a capacitor, a resistor, an inductor, a filter or an active component in the form of an SMT component.

An active component may further be provided in the form of an LED. A respective LED may be used to indicate a status of a chip mounted on the chip module. Furthermore, the LED may be used to transfer information encoded in a light emission pattern.

Thin-film layer may have a thickness of less than 100 μm, e.g. between 10 μm and 50 μm. A thick-film layer may have a thickness of 100 μm and more, e.g. between 100 μm and 300 μm.

According to an example, the discrete electronic device is an SMT component. This may allow for using known standardized components. Standardized surface mount components may have the advantage to be smaller than their counterparts with leads, and are designed to be handled by machines rather than by humans. The electronics industry has standardized package shapes and sizes, wherein a leading standardization body is the Joint Electron Device Engineering Council (JEDEC). The codes given in TAB. 2 below usually refer to the length and width of the components in tenths of millimeters (metric size) or hundredths of inches (imperial size). It is understood that the lengths and widths given below are assigned with precision tolerances. For example, a metric 2520 component is 2.5 mm by 2.0 mm which corresponds roughly to 0.10 inches by 0.08 inches. Hence it is referred to as imperial size 1008. Exceptions regarding this system of assignment may occur for imperial sizes in the smallest rectangular sizes. However, the metric codes in general may still represent the dimensions in mm, even though the imperial size codes may no longer be aligned. Standardized block-shaped rectangular SMT components have a square cross-section.

TABLE 2

Standardized device sizes

| type | | dimension | | | |
| --- | --- | --- | --- | --- | --- |
| metric | imperial | length [mm] | width [mm] | length [inch] | width [inch] |
| 0402 | 01005 | 0.40 | 0.20 | 0.016 | 0.008 |
| 0603 | 0201 | 0.60 | 0.30 | 0.024 | 0.012 |
| 1005 | 0402 | 1.02 | 0.50 | 0.040 | 0.020 |

An embodiment of a chip module may be symmetrical with respect to an imaginary horizontal plane vertically arranged in the middle between the horizontal top and the bottom surface of the chip module. An embodiment may include sections with signal layers vertically arranged in the middle between the horizontal top and the bottom surface of the chip module, while sections with power layers are arranged between the sections with signal layers and the horizontal top and the bottom surface, respectively. In an alternative embodiment, sections with power layers may be vertically arranged in the middle between the horizontal top and the bottom surface of the chip module, while sections with signal layers are arranged between the sections with power layers and the horizontal top and the bottom surface, respectively.

For example, the total thickness of the plurality of thick-film in the vertical center of chip module may e.g. be around 0.6 mm. The total thickness of chip module may e.g. be around 1.2 mm. These distances e.g. correspond to the length of a type 0201 component which is 0.6 mm or the length of a type 0402 component which is 1.02 mm. Thus, a type 0201 or 0402 component perfectly fits in between those layers, with their longitudinal axis aligned in vertical direction, i.e. perpendicular to the surface. Furthermore, in view of their width of 0.3 mm and 0.5 mm, respectively, they fit within a plurality of thin-film layers with their longitudinal axis aligned in horizontal direction.

According to an embodiment, electrically conductive layers of a first set of the electrically conductive layers each includes an electrically non-conductive clearance along a first part of the circumferential boundary of a predefined portion along which the first trench is provided. Meanwhile, the electrically conductive layers of the respective first set each include an electrically conductive structure reaching to a second part of a circumferential boundary of the predefined portion, along which the second trench is provided. Electrically conductive layers of a second set of the electrically conductive layers each includes an electrically non-conductive clearance along the second part of the circumferential boundary of the predefined portion. Meanwhile the electrically conductive layers of the respective second set each include an electrically conductive structure reaching to the first part of the circumferential boundary of the predefined portion.

According to an embodiment, electrically conductive layers of a third set of the electrically conductive layers each include an electrically non-conductive clearance along the first part, as well as the second part of the circumferential boundary of the predefined portion.

According to an embodiment, the first electrically conductive connection connects the first electrical contact with the electrically conductive structures of the electrically conductive layers of the first set of the electrically conductive layers. The second electrically conductive connection connects the second electrical contact with the electrically conductive structures of the electrically conductive layers of the second set of the electrically conductive layers.

According to an embodiment, the chip module includes a plurality of predefined electrically non-conductive portions for embedding a plurality of a discrete electronic device peripherally distributed around the chip module.

According to an embodiment, the chip module is part of a multilayer substrate panel including a plurality of chip modules. The method further includes separating the individual chip modules from each other after applying the first and second platings to the respective chip modules.

Referring now to FIG. 1A, a schematic of a view of a top surface of an exemplary chip module is shown, in accordance with an embodiment of the present invention. In FIG. 1A, a schematic of a view of a top surface 120 of an exemplary chip module 100 provided with predefined lateral portions 110 for embedding of discrete electronic devices. The chip module 100 is provided in the form of a multilayer substrate with a square cross-section. In a center of the top surface 120 of the chip module 100, a chip area 130 is provided for mounting a chip. Within the chip area 130, a plurality of connections are provided for connecting the chip to internal electrically conductive layers of the chip module 100. Along edges of the top surface 120 a plurality of predefined lateral portions 110 for embedding of discrete electronic devices is provided. According to an embodiment, predefined lateral portions 110 for embedding of discrete electronic devices may be provided along all edges of the top surface 120, i.e. in all side surfaces of the chip module 100.

A chip may be mounted onto the chip area 130 using for example the flip chip method, also known as controlled collapse chip connection (C4). The chip may be connected to connections provided by the chip area 130 with solder bumps that have been deposited onto chip pads. The solder bumps may be deposited on the chip pads on the top side of the wafer during the final wafer processing step. In order to mount the chip to chip area 130, it is flipped over so that its top side faces down, and positioned such that its pads align with matching connections of the chip area 130. Then the solder is remelted, using e.g. hot air reflow, to complete the connection. Finally, the mounted chip may be underfilled using an electrically-insulating adhesive.

Figure 1B:
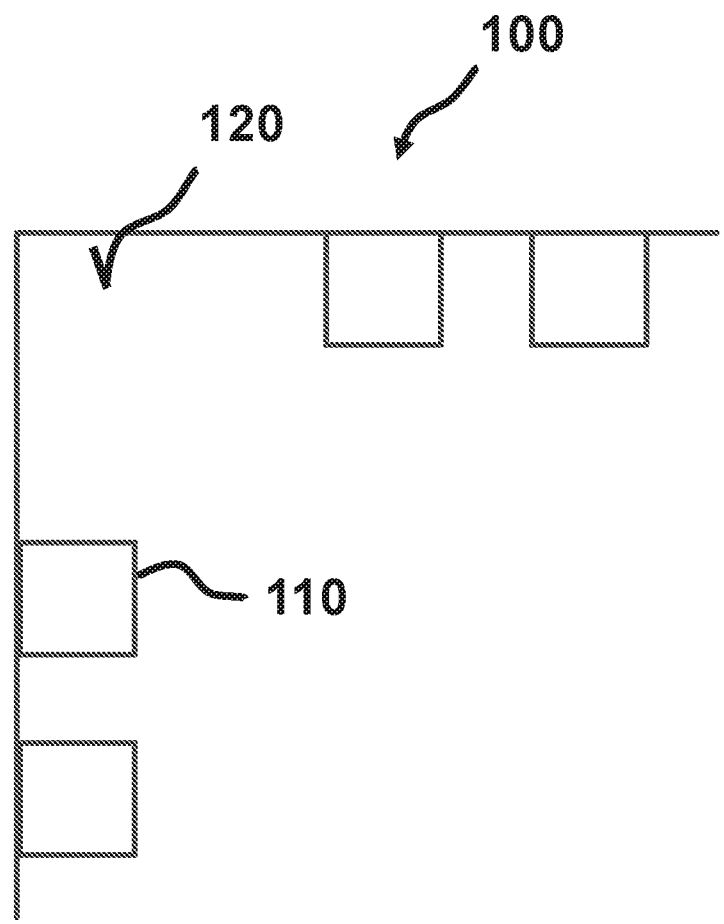

Referring now to FIG. 1B, a schematic of a view of a top surface of an exemplary chip module is shown, in accordance with an embodiment of the present invention. FIG. 1B shows a partial schematic of a corner of the chip module 100 of FIG. 1A with a plurality of predefined lateral portions 110 for embedding of discrete electronic devices. The predefined lateral portions 110 are located along the edge of the top surface 120.

Figure 2:
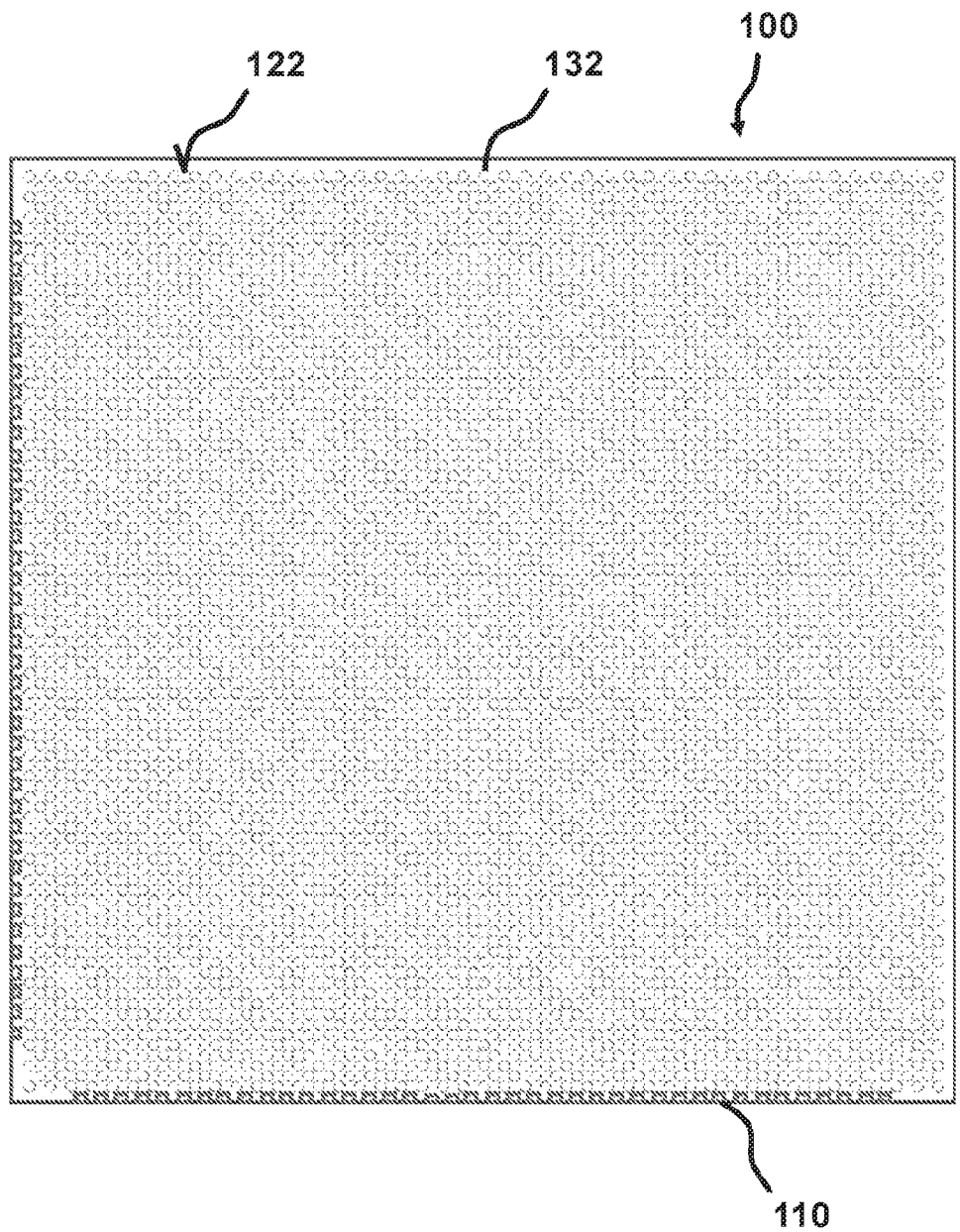
FIG. 2 depicts a schematic of a view of a bottom surface of the exemplary chip module of FIGS. 1A and 1B.

Referring now to FIG. 2, a schematic of a view of a bottom surface 122 of the exemplary chip module 100 of FIGS. 1A and 1B, is shown, in accordance with an embodiment of the present invention. The bottom surface 122 provides a bottom side metallization area (BSM) providing a plurality of electrically conductive connections 132 to the chip mounted on the top surface 120 (not shown) of the chip module 100 via electrically conductive layers of the multilayer substrate. The plurality of electrically conductive connections 132 may for example be provided in the form of pads. The predefined lateral portions 110 for embedding of discrete electronic devices are sized and distributed along the edge of the bottom surface such that they each fit between two peripheral pads of the plurality of electrically conductive connections 132. The predefined lateral portions 110 for embedding of discrete electronic devices shown in FIGS. 1A and 1B extend through the entire chip module to the bottom surface 122.

Figure 3:
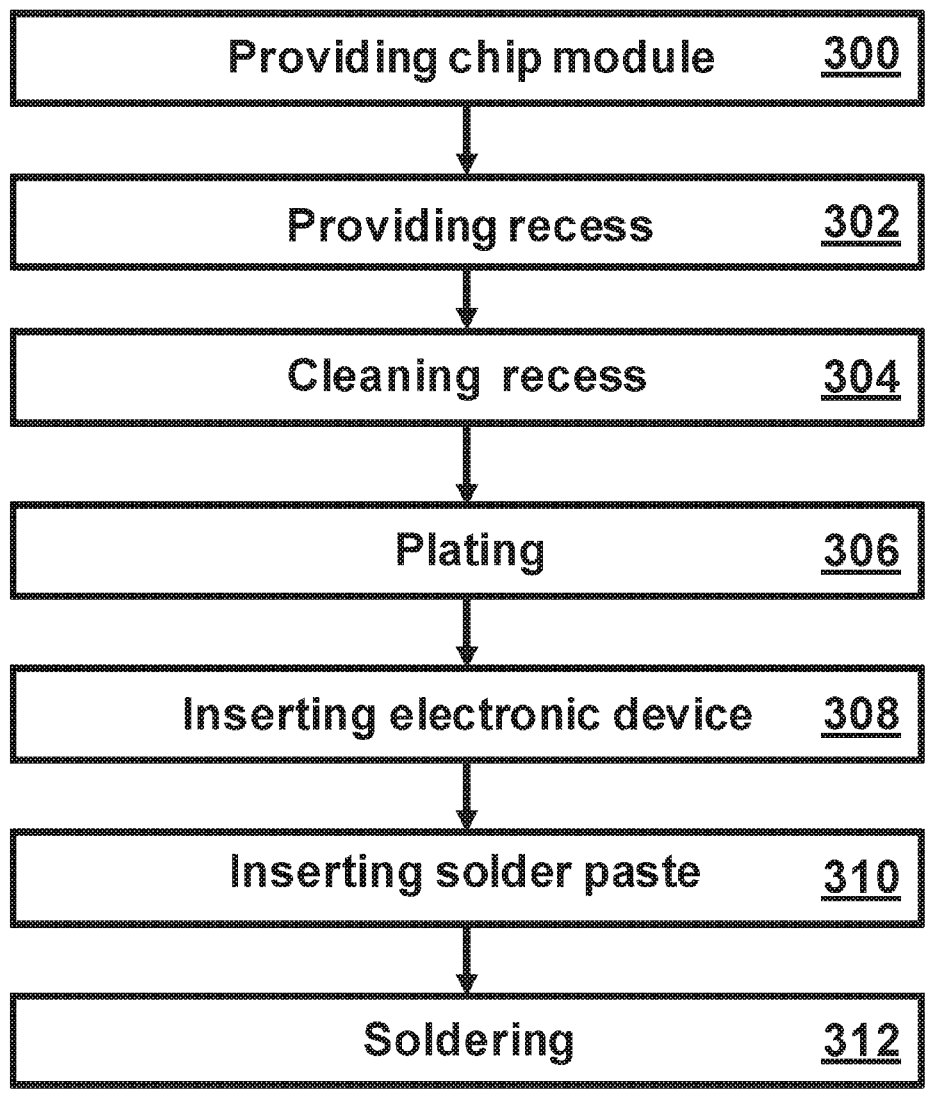
FIG. 3 is a flowchart describing an exemplary first method of embedding a discrete electronic device in a chip module as shown in FIGS. 1A, 1B, and 2.

Referring now to FIG. 3, a flowchart describing an exemplary first method of embedding a discrete electronic device in a chip module as shown in FIGS. 1A, 1B, and 2, is shown, in accordance with an embodiment of the present invention. Discrete electronic devices may be embedded laterally in the chip module of FIGS. 1A, 1B, and 2, by the following additional manufacturing steps according to the schematic flowchart depicted in FIG. 3. In step 300 a chip module with predefined portions for embedding of discrete electronic devices is provided, i.e. an organic or ceramic multilayer substrate with vias and/or micro-vias connecting electrically conductive layers of the substrate is built according to a standardized manufacturing process. The chip module includes a plurality of lateral predefined portions for embedding discrete electronic devices into a sidewall of the chip module. In step 302, lateral recesses are provided in the chip module. The recesses may for example be drilled, milled or laser cut. The recesses may include an elongated rectangular form with the longitudinal axes of the recesses extending vertically through the entire chip module. In step 304 the recesses are cleaned. In step 306, first and second electrically conductive plating are added, spaced apart from each other, onto the inner surface of each recess. The first and second plating each provide an electrically conductive connection to one or more of the electrically conductive layers of the substrate. The first and second plating may be connected to different electrically conductive layers. In step 308, discrete electronic devices are inserted into each recess. The discrete electronic devices may be fixed in place by applying an adhesive. Next a first electrically conductive connection is established between a first electrical contact of the discrete electronic device and at least a first electrically conductive structure. Further, a second electrically conductive connection is established between a second electrical contact of the discrete electronic device and at least a second electrically conductive structure. The first plating may provide the first electrically conductive connection for the first electrical contact and the second plating may provide the second electrically conductive connection for the second electrical contact. In order to establish the first and second connection, solder paste may be inserted into each of the recesses to the first and second contacts in step 310. In step 312, the solder paste is soldered, e.g. by a hot gas, laser or infrared soldering process.

Figure 4A:
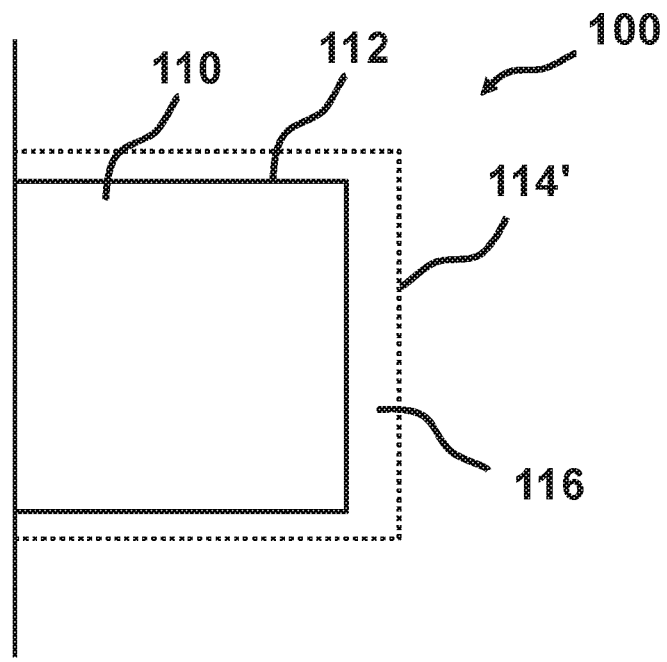
FIGS. 4A and 4B depict schematics of views of one of the predefined lateral portions of the exemplary chip module of FIGS. 1A, 1B, and 2.

Referring now to FIG. 4A, a first schematic of a view of one of the predefined lateral portions 110 of the exemplary chip module 100 of FIGS. 1A, 1B and 2, is shown, in accordance with an embodiment of the present invention. The dotted lines 114' indicate a first electrically conductive structure of an internal electrically conductive layer. The first electrically conductive structure 114' is not intended to be connected to the discrete electronic device to be embedded. Therefore, the first electrically conductive structure 114' is provided with a clearance 116 around the boundary 112 of the one of the predefined lateral portions 110. The clearance 116 is filled with an electrically non-conductive material insulating the first electrically conductive structure 114' with respect to the electrical contacts of the discrete electronic device.

Figure 4B:
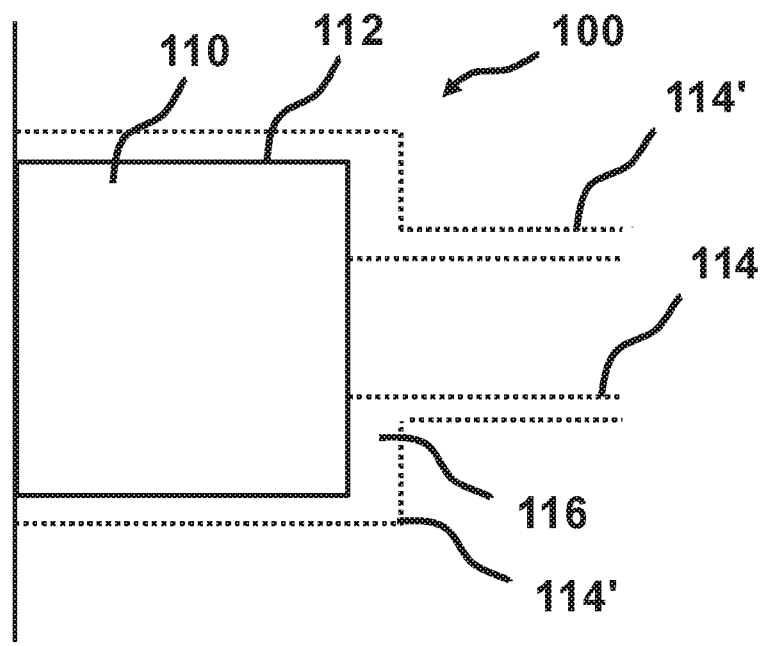

Referring now to FIG. 4B, a second schematic of a view of one of the predefined lateral portions 110 of the exemplary chip module 100 of FIGS. 1A, 1B and 2, is shown, in accordance with an embodiment of the present invention. The dotted lines 114' indicate an additional first electrically conductive structure of another internal electrically conductive layer. The second electrically conductive structure 114 is intended to be connected to the discrete electronic device to be embedded. Therefore, the second electrically conductive structure 114 extents to the predefined lateral portion 110. When a recess is provided to the predefined lateral portion 110, edges of the second electrically conductive structure 114 are exposed to sidewalls of the recess. Thus, an efficient electrically conductive connection may be established between a plating of the recess and the second electrically conductive structure 114. The other internal electrically conductive layer may include additional first electrically conductive structures 114', e.g. GND structures, which are not intended to be connected with the discrete electronic device. The additional first electrically conductive structures 114' may therefore include a clearance separating and insulating the second electrically conductive structure 114 from the additional first electrically conductive structure 114' as well as the predefined lateral portion 110. According to an alternative embodiment, the second electrically conductive layer may include a continuous second electrically conductive structure 114 fully covering a boundary of the predefined lateral portion 110, without additional structures of different levels of voltage at a same layer insulated against the predefined lateral portion 110.

Figure 5:
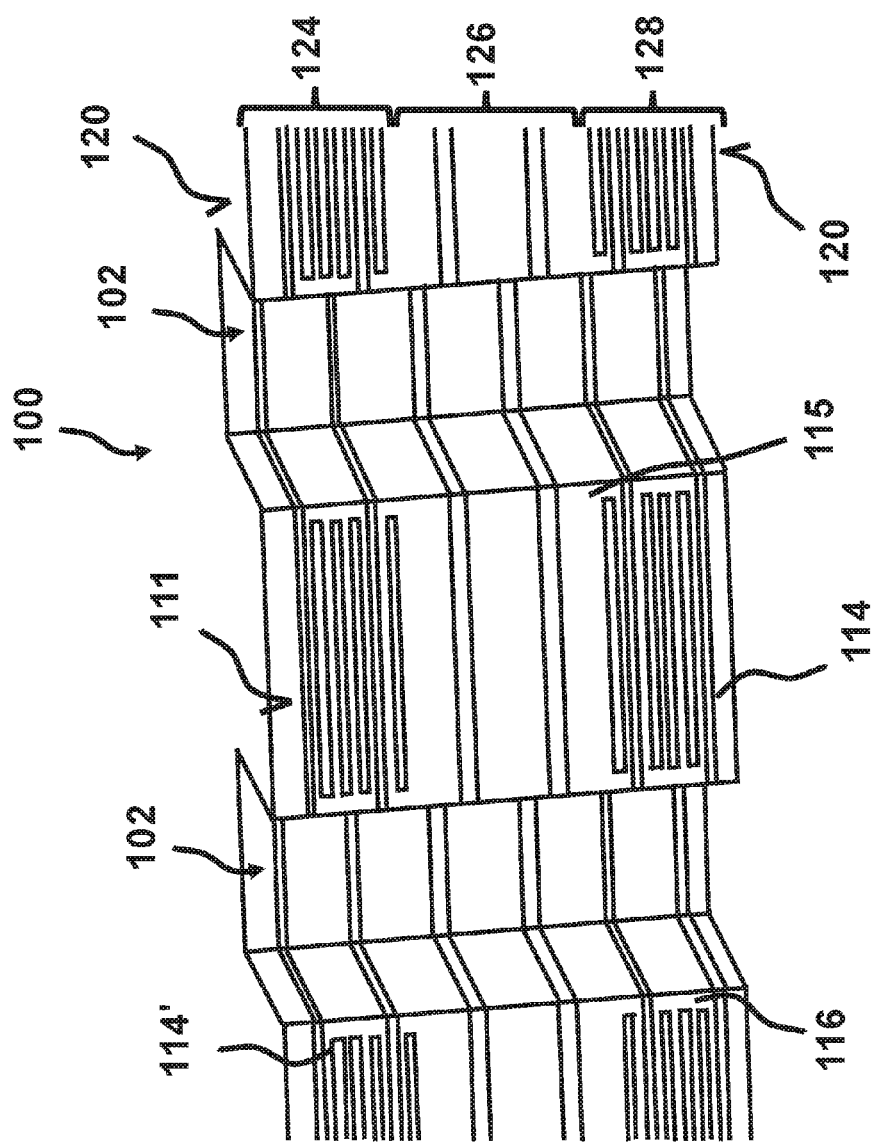
FIG. 5 depicts a schematic of a partial view of a corner of the exemplary chip module of FIG. 2 with recesses provided to the predefined lateral portions.

Referring now to FIG. 5, a schematic of a partial view of two predefined lateral portions, e.g. two of the predefined lateral portions or recesses 102 next to the corner of the chip module 100 of FIG. 1B, with recesses 102 provided to the predefined lateral portions, is shown, in accordance with an embodiment of the present invention. Edges of the second electrically conductive structures 114 intended to be connected to the discrete electronic devices to be embedded are exposed within the recesses 102. The first electrically conductive structures 114' intended not to be connected to the discrete electronic devices to be embedded are not exposed within the recesses 102 due to the clearances 116. A front face 111 shown in FIG. 5 is a cross-section of the chip module 100 parallel to a side surface of the chip module 100 in order to illustrate exemplary internal structures of the chip module 100. The chip module 100 may be configured such that its side surface is sealed with electrically non-conductive material. This may be achieved by providing each electrically conductive layer with a clearance between its second electrically conductive structures 114, first electrically conductive structures 114' and the side surface. The multilayer substrate provided by the chip module 100 may be configured such that that an upper set 124 of layers next to the top surface as well as an lower set 128 of layers next to the bottom surface includes thin-film layers, while a central set 126 of layers includes thick-film layers.

Figure 6:
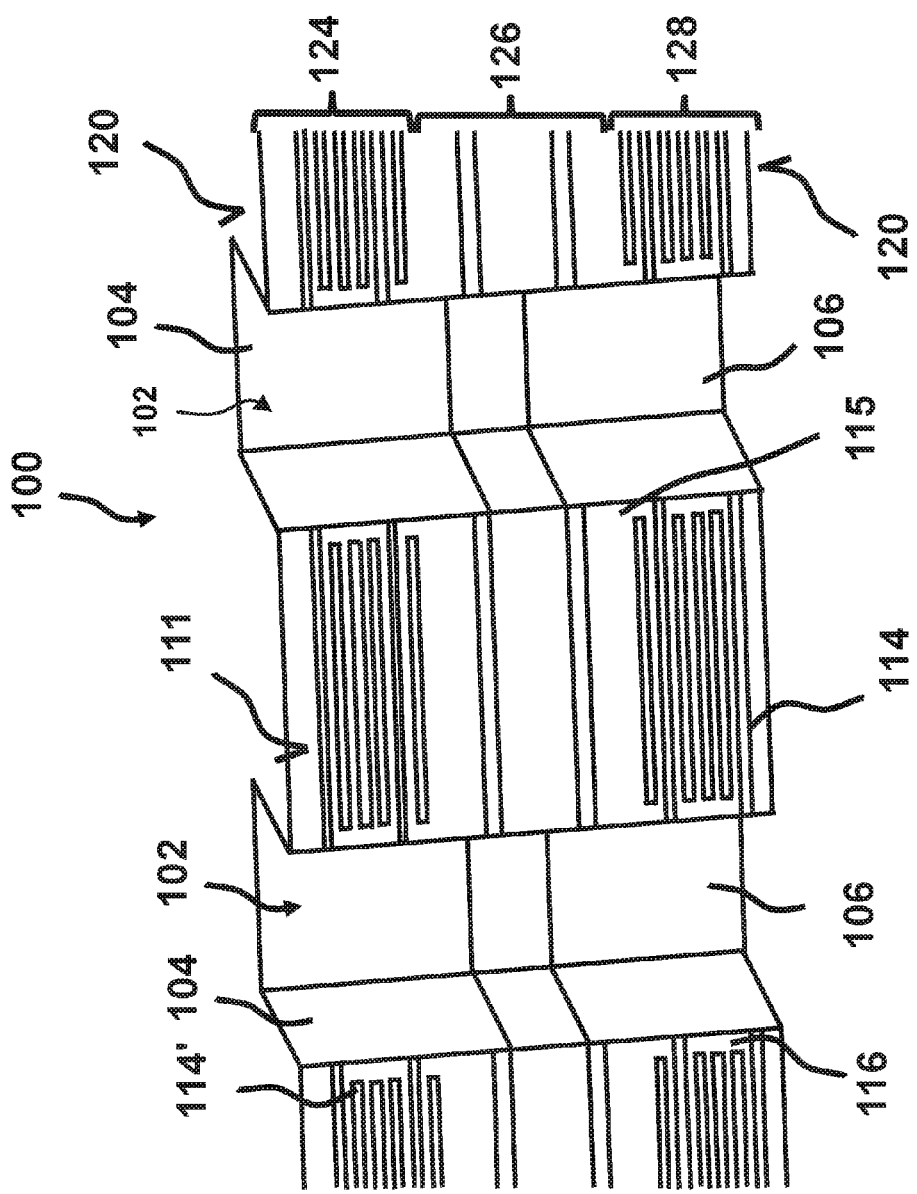
FIG. 6 depicts a schematic of a view of two of the recesses of the exemplary chip module of FIG. 5.

Referring now to FIG. 6, a further schematic of a partial view of the two recesses 102 of FIG. 5, is shown, in accordance with an embodiment of the present invention. In FIG. 6, a further state of the method is illustrated. Each recess 102 has been provided a first and a second plating 104, 106. The front face 111, a horizontal electrically non-conductive layer 115, and the clearance 116 are shown. The first, second platings 104, 106 are placed spaced apart from each other. By placing the first, second platings 104, 106 spaced apart from each other, an efficient insulation between the first, second platings 104, 106 is implemented. According to the embodiment shown in FIG. 6 the first plating 104 covers the upper set 124 of thin-film layers, while the second plating 106 covers the lower set 128 of thin-film layers. The central set 126 of layers may be partially covered by first, second platings 104, 106, and there may be a space between the first, second platings 104, 106. The second electrically conductive structure 114 with edges which have been exposed by the recess 102 is connected to the first, second platings 104, 106. The first electrically conductive structure 114' is not connected to the first, second platings 104, 106.

Figure 7:
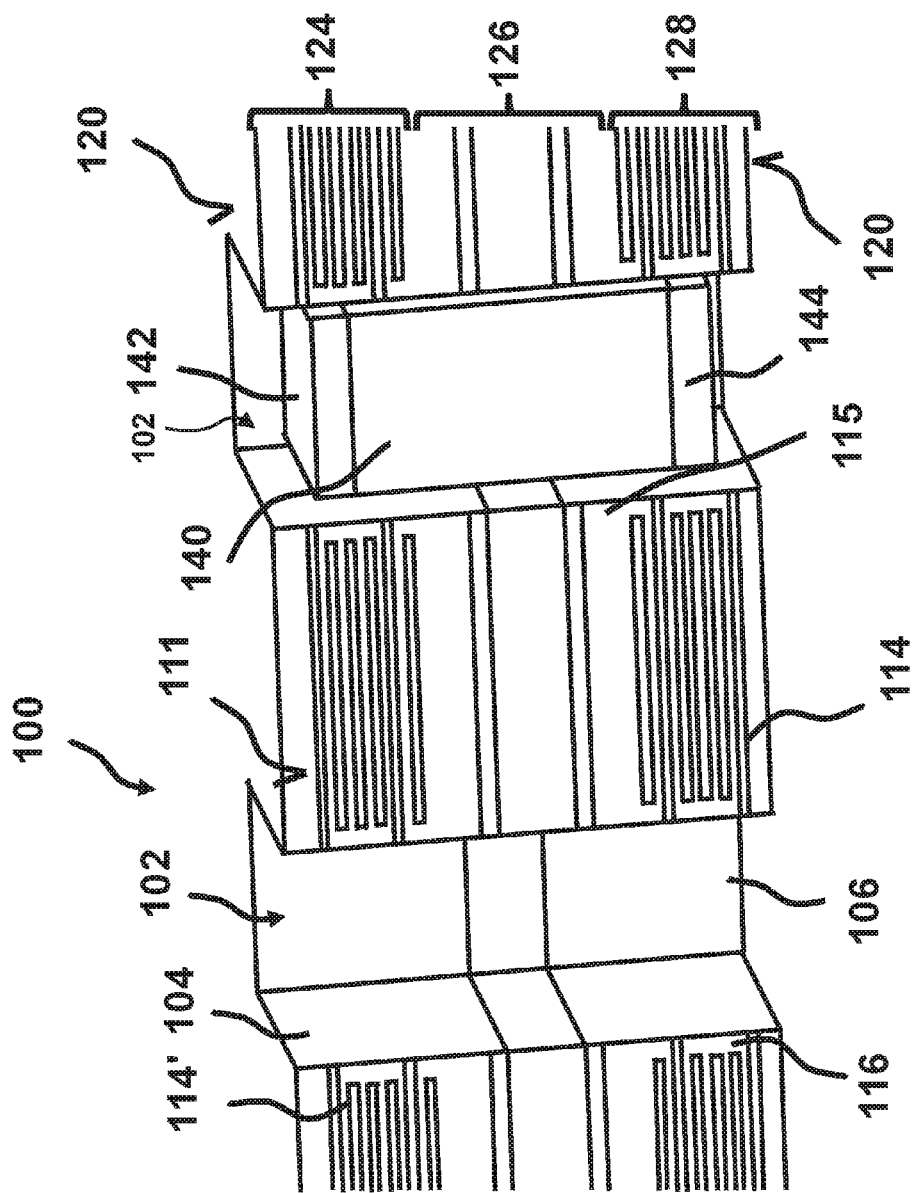
FIG. 7 depicts a schematic of the view of the recesses of FIG. 6 with a discrete electronic device embedded in one of the recesses.

Referring now to FIG. 7, a schematic of the view of the recesses 102 of FIG. 6 with a discrete electronic device 140 embedded in one of the recesses 102, is shown, in accordance with an embodiment of the present invention. The discrete electronic device 140 includes a first and a second electrical contact 142, 144 spaced apart from each other. When being inserted, the discrete electronic device 140 may vertically be aligned such that the first electrical contact 142 rests on the first plating 104 and the second electrical contact 144 rests on the second plating 106. The front face 111, the horizontal electrically non-conductive layer 115, the clearance 116, the first electrically conductive structure 114', the second electrically conductive structure 114, are shown. Also shown is the upper set 124 of thin-film layers, the central set 126 of layers, and the lower set 128 of thin-film layers.

Figure 8A:
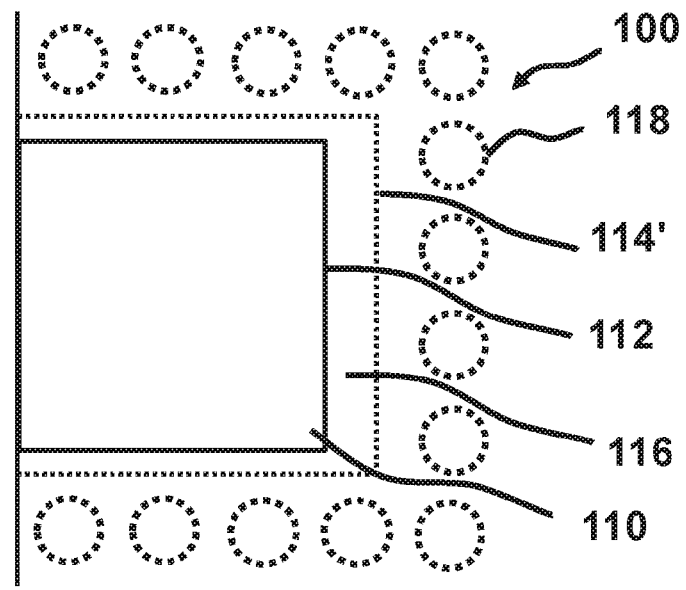
FIGS. 8A and 8B depicts a schematic of the predefined portion of FIGS. 4A and 4B with a plurality of ground vias distributed peripherally around the predefined portion.

Referring now to FIG. 8A, a schematic of the predefined lateral portion 110, and the boundary 112, of FIG. 4A with a plurality of GND vias 118 distributed peripherally around the predefined lateral portion 110 is shown, in accordance with an embodiment of the present invention. The first electrically conductive structure 114' is not connected to the predefined lateral portion 110, but rather separated by the clearance 116 filled with electrically non-conductive material. The first electrically conductive structure 114' may, for example, be a GND structure. By providing additional GND micro-vias of the plurality of GND vias 118 around a discrete electronic device, e.g. a capacitor, a loop inductance of the respective discrete electronic device may be efficiently improved. The plurality of GND micro-vias 118 indicated in FIG. 8A may be located at different vertical levels, thereby providing an indirect connection from the first electrically conductive structure 114', which may be a GND structure, through the chip module 100 to a further GND structure of a layer located at a lower level of the stack.

Figure 8B:
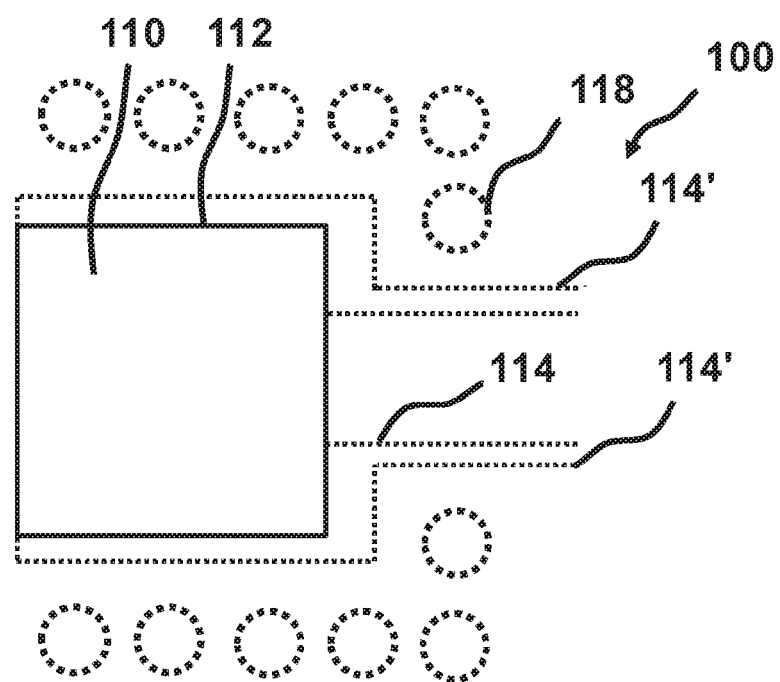

FIG. 8B shows a schematic of the predefined lateral portion 110, and the boundary 112, of FIG. 4B with a plurality of GND vias 118 distributed peripherally around the predefined lateral portion 110. The first electrically conductive structures 114' not connected to the predefined lateral portion 110 may be a GND structure. By providing additional GND micro-vias of the plurality of GND vias 118 around a discrete electronic device, like e.g. a capacitor, the loop inductance of the respective discrete electronic device may be efficiently improved. The plurality of GND micro-vias 118 indicated in FIG. 8B may be located at different vertical levels, thereby providing an indirect connection from the electrically conductive structure 114', which may be a GND structure, through the chip module 100 to a further GND structure. The second electrically conductive structure 114 is intended to be connected with a discrete electronic device to be embedded.

Figure 9:
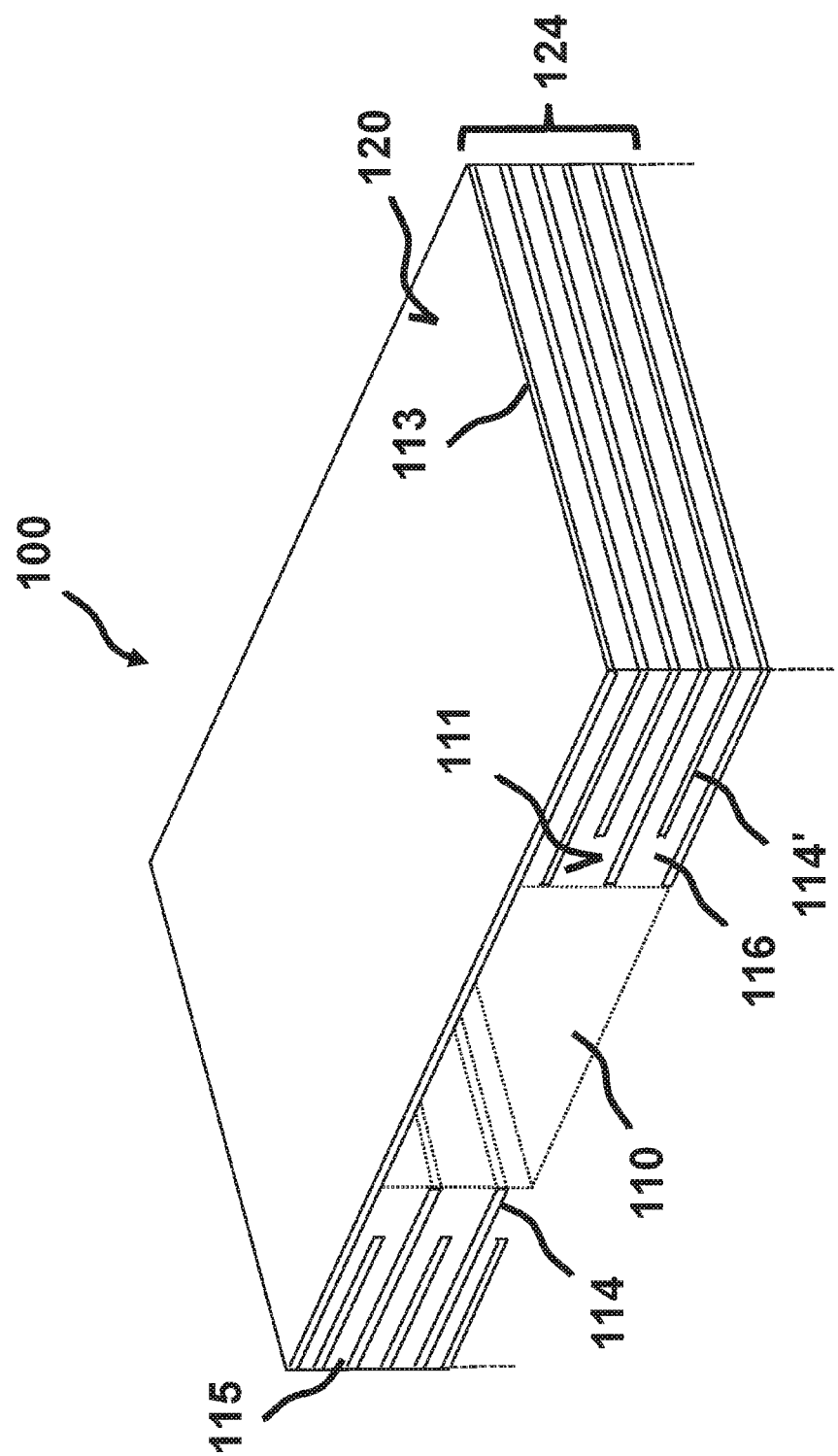
FIG. 9 depicts a schematic of a partial view of an exemplary chip module with a predefined lateral portion for embedding of a discrete electronic device.

Referring now to FIG. 9, a partial view of the multilayer substrate of the chip module 100, is shown, according to an embodiment of the present invention. The substrate of the chip module 100 may for example be part of a multilayer substrate panel for manufacturing a plurality of chip modules 100 with a plurality of discrete electronic devices embedded therein. The partial view of an exemplary chip module 100 includes the predefined lateral portion 110 for embedding of a discrete electronic device. The chip module 100 may extend further downwards as indicted by the dashed lines. In addition, the chip module may extend further in a lateral direction. A continuing portion of the chip module 100 is indicated by dotted lines and may for example have the form of an elongated rectangular block. The chip module 100 may include a plurality of horizontal electrically conductive structures 114', and second electrically conductive structures 114 being separated from each other by the horizontal electrically non-conductive layer 115. The chip module 100 may further include a predefined electrically non-conductive portion 110 for embedding a discrete electronic device. The predefined lateral portions 110 may be located at a side surface of the chip module and extend vertically through the upper set 124 of layers. The upper set 124 of layers may include the electrically conductive structure 114' which is designed such that it does extend into the predefined lateral portion 110, which is filled with electrically non-conductive material. The horizontal electrically conductive structures 114', and second electrically conductive structures 114, may further include holes (not shown) at predefined positions, at which vias are added. The front face 111 shown is a cross-section through the chip module 100 parallel to a side surface in order to illustrate exemplary internal structures of a chip module 100.

The second electrically conductive structures 114 to be connected to a discrete electronic device to be embedded within the predefined lateral portion 110 may reach the boundary of the predefined lateral portion 110 as indicated by dotted lines. The electrically conductive structures 114' not to be connected to a discrete electronic device may be provided with the clearance 116 located between the electrically conductive structure 114' and a boundary of the predefined lateral portion 110. The clearance 116 may be filled with an electrically non-conductive material, such that an efficient insulation is provided.

The chip module 100 may e.g. be provided in the form of organic laminated multilayer substrate. The top surface 120 according to the embodiment shown in FIG. 9 may be provided by an uppermost electrically conductive layer 113, e.g. in the form of a continuous copper layer.

Figure 10:
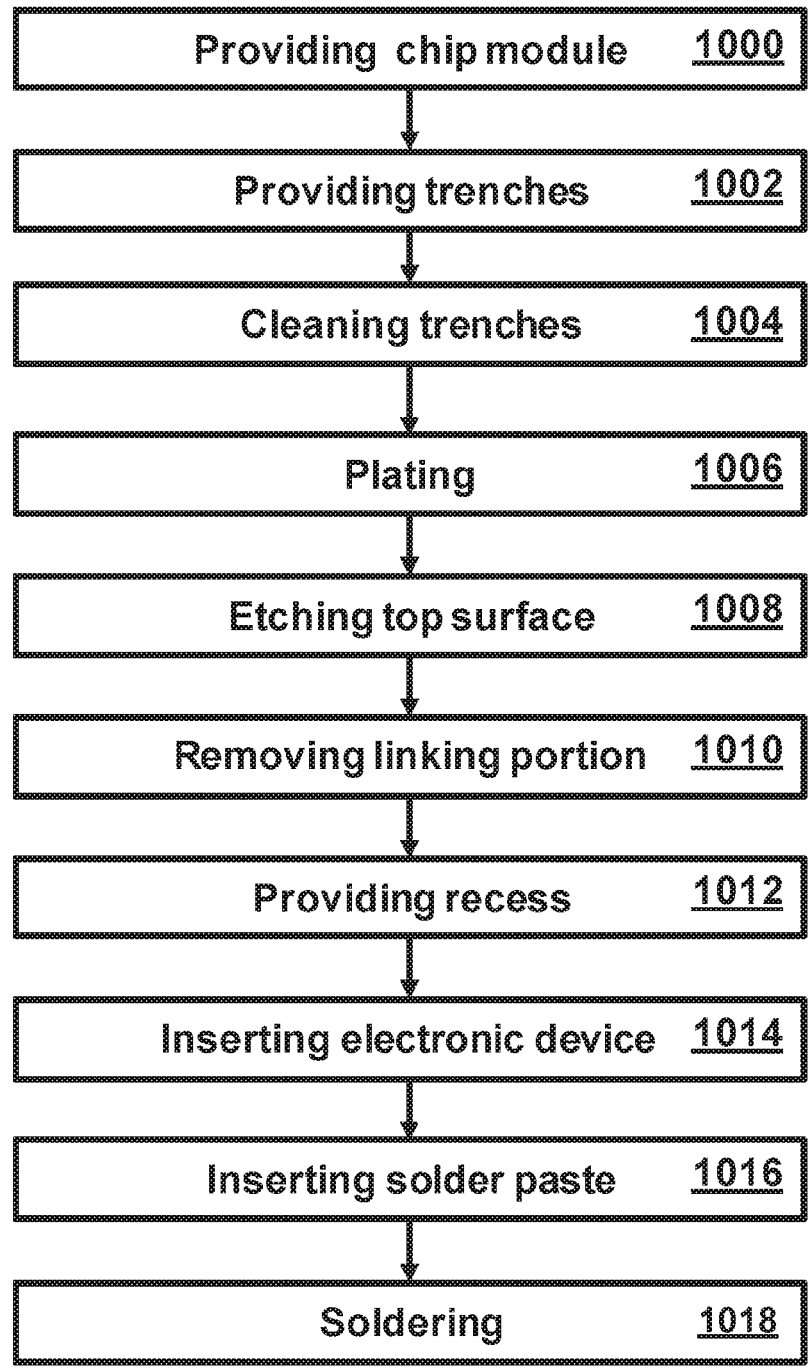
FIG. 10 is a flowchart describing an exemplary second method of embedding a discrete electronic device in the predefined portion of FIG. 9.

Discrete electronic devices may be embedded laterally in the chip module of FIG. 9 by the following additional manufacturing steps according to the schematic flowchart depicted in FIG. 10, following.

Referring now to FIG. 10, a flowchart describing an exemplary second method of embedding a discrete electronic device in the predefined lateral portion 110 of FIG. 9 is shown, in accordance with an embodiment of the present invention. In step 1000 the chip module of FIG. 9 may be provided. In step 1002, providing two trenches may be provided in the top surface along a circumferential boundary of the predefined portion, such that a linking portion remains between the two trenches connecting the predefined portion with the rest of the substrate. In step 1004 the trenches are cleaned. In step 1006, an electrically conductive plating is added to the inner surfaces of each of the trenches. In step 1008, the top surface is etched in order to define electrically conductive structures on top of the chip module, which may provide electrically conductive connections to the discrete electronic devices. For the etching, a solder mask may be used capable to perform a tenting of the trenches, e.g. by a dry film.

In step 1010, the linking portion is removed. In step 1012, the recess is provided by removing the remaining part of the predefined portion extending between the two trenches. The recess extends along a peripheral edge of the top surface. The basis of the remaining part of the predefined portion may e.g. be loosened by laser cutting. In step 1014, a discrete electronic device is inserted into the recess. The discrete electronic device may be fixed in place by applying an adhesive. Next a first electrically conductive connection is established between a first electrical contact of the discrete electronic device and at least a first electrically conductive structure. Further, a second electrically conductive connection is established between a second electrical contact of the discrete electronic device and at least a second electrically conductive structure. The remaining plating of the first trench may provide the first electrically conductive connection for the first electrical contact and the remaining plating of the second trench may provide the second electrically conductive connection for the second electrical contact. In order to establish the first and second connection, solder paste may be inserted into each of the recesses to the first and second contacts in step 1016. In step 1018, the solder paste is soldered, e.g. by a hot gas, laser or infrared soldering process.

Figure 11:
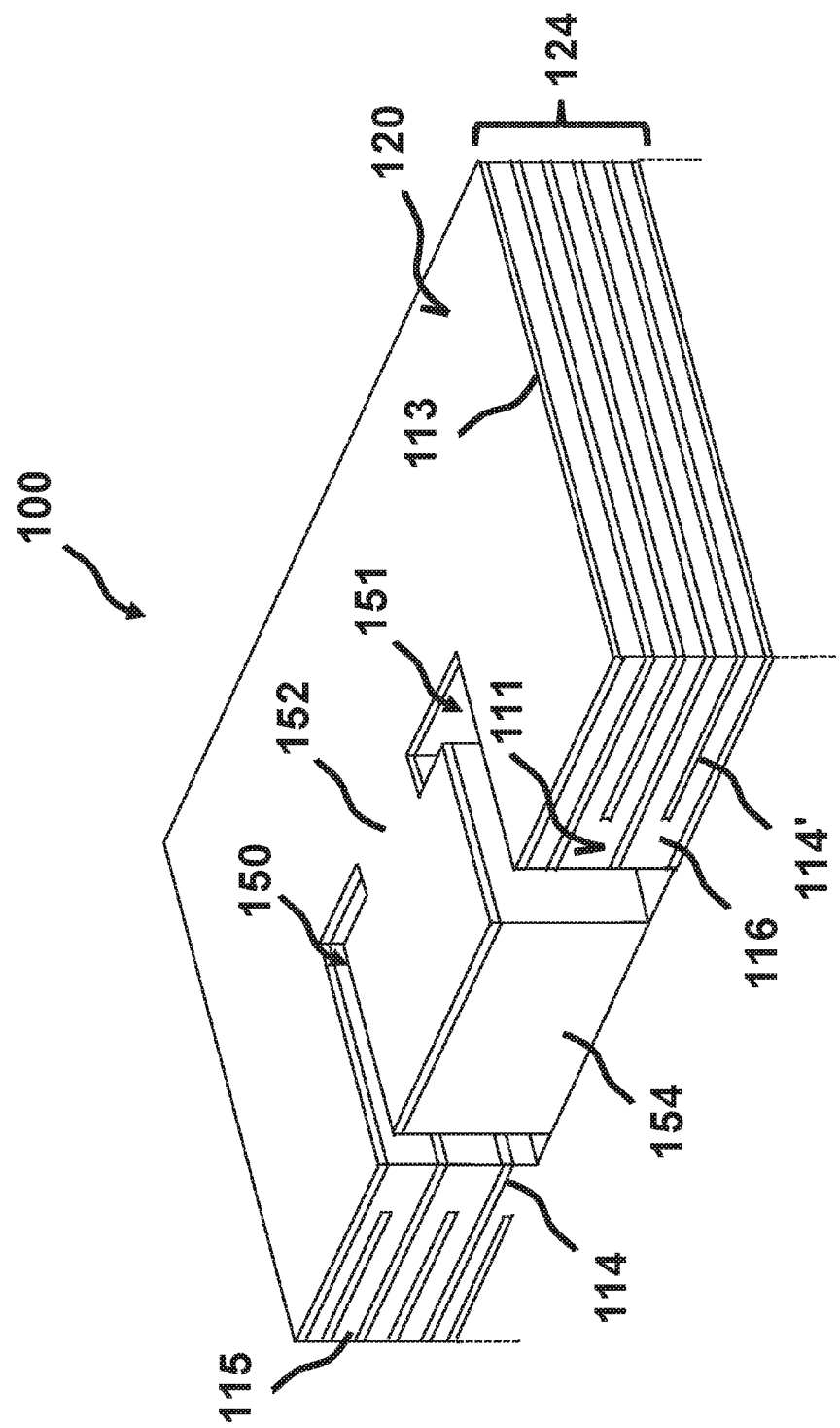
FIG. 11 depicts a schematic of the partial view of FIG. 9 with two trenches provided along the boundary of the predefined portion.

Referring now to FIG. 11, a schematic of the partial view of FIG. 10 of the chip module 100 with two trenches 150, 151, provided along a boundary of a second predefined portion, is shown, according to an embodiment of the present invention. The two trenches 150, 151 are provided, e.g. by milling or laser cutting, such that a linking portion 152 remains between the two trenches 150, 151, connecting the second predefined portion with the rest of the substrate. Thereby, the respective electrically conductive structures 114 of the stack may be exposed at outer sidewalls of the two trenches 150, 151. The two trenches 150, 151 may, for example, be provided when an additional operation takes place, e.g. drilling vias or PTHs. Also shown is the top surface 120, the front face 111, the uppermost electrically conductive layer 113, the horizontal electrically non-conductive layer 115, the electrically conductive structure 114', the clearance 116, the upper set 124 of thin-film layers, and a remaining part 154 of the second predefined portion.

Figure 12:
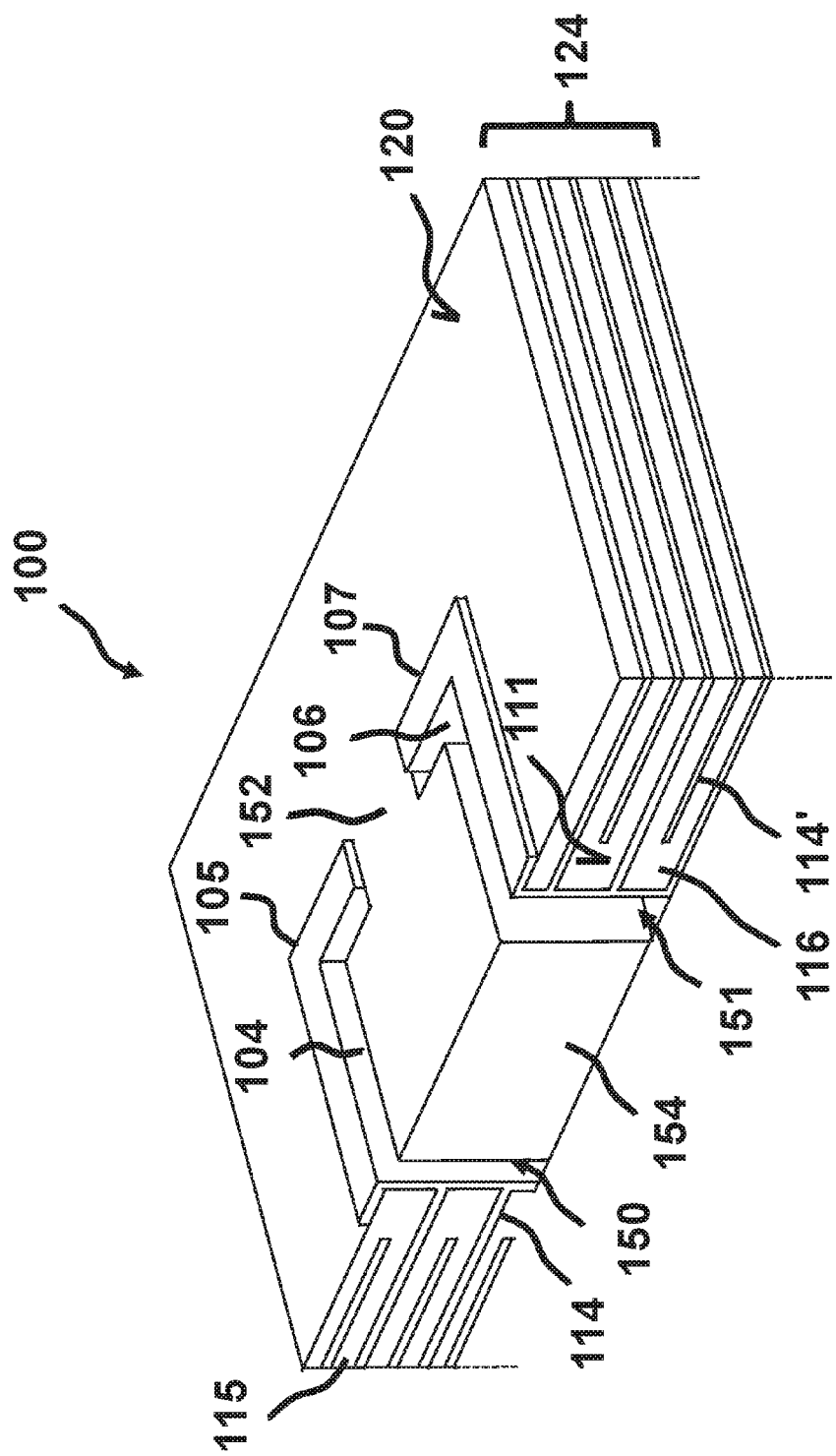
FIG. 12 depicts a schematic of the partial view of FIG. 11 after plating of the two trenches.

Referring now to FIG. 12, a schematic of the partial view of FIG. 11 of the chip module 100 after plating of the two trenches 150, 151 is shown, according to an embodiment of the present invention. The two trenches 150, 151 shown in FIG. 11 may be cleaned and plated as shown in FIG. 12. Thus, outer sidewalls of the trenches 150, 151 are provided with the first, second platings 104, 106. The plating may be executed simultaneously when the vias and PTHs are plated. Due to exposed edges of the second electrically conductive structures 114, e.g. copper layers, within the outer sidewalls of the trenches 150, 151, the outer sidewalls may be provided with a full metallization. In an embodiment, bottoms of the trenches 150, 151 may be metalized. The metallization may be provided by an electrically conductive layer exposed at the bottoms of the trenches 150, 151, when the same are plated. In an alternative embodiment, the bottoms of the trenches 150, 151 may not be metalized.

Additionally, the top surface 120 may be etched into circuit features. Etching of the top surface 120 may include defining of metal features 105, 107, i.e. connections that are of interest for connecting to the discrete electronic devices. For the etching, a solder mask may be used capable to perform a tenting of the trenches 150, 151, e.g. by a dry film. Also shown is the front face 111, the horizontal electrically non-conductive layer 115, the electrically conductive structure 114', the clearance 116, the upper set 124 of thin-film layers, the linking portion 152, and the remaining part 154 of the second predefined portion.

Figure 13:
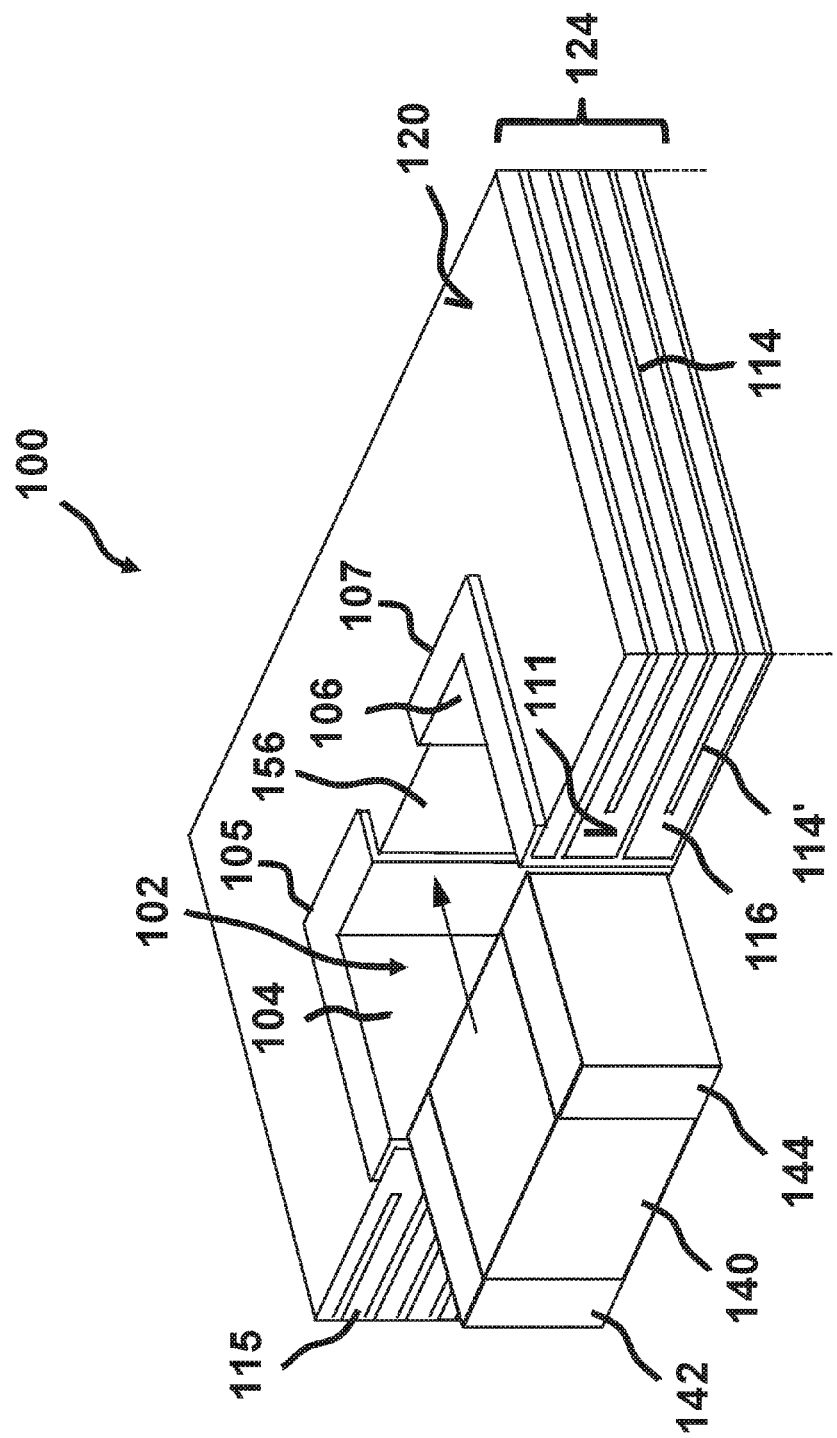
FIG. 13 depicts a schematic of the partial view of FIG. 12 with a recess provided to the predefined portion into which a discrete electronic device is inserted.

Referring now to FIG. 13, a schematic of the partial view of FIG. 11 of the chip module 100 with the recess 102 provided to a third predefined portion into which a discrete electronic device 140 is inserted, is shown, according to an embodiment of the present invention. The linking portion 152 of FIG. 11 between the two trenches 150, 151 has been removed. A remaining portion 156, where the linking portion 152 had been connected to the rest of the substrate is not plated and thus electrically separates the first plating 104 of the first trench 150 and the second plating 106 of the second trench 151. A final cutting operation, e.g. by laser cutting, is removes the remaining part 154 of the predefined lateral portion 110 as shown in FIG. 12. After the recess 102 has been provided by removing the remaining part 154 of the predefined lateral portion 110, a discrete electronic device 140 may be inserted into the recess 102 and electrically conductive connections may be provided by soldering between the first and second electrical contact 142, 144 of the discrete electronic device 140 and the first, second platings 104, 106 of the first and second trench 150, 151, respectively.

Also shown is the metal features 105, 107, the top surface 120, the front face 111, the horizontal electrically non-conductive layer 115, the first electrically conductive structure 114', the second electrically conductive structure 114, the clearance 116, the upper set 124 of thin-film layers.

Figure 14:
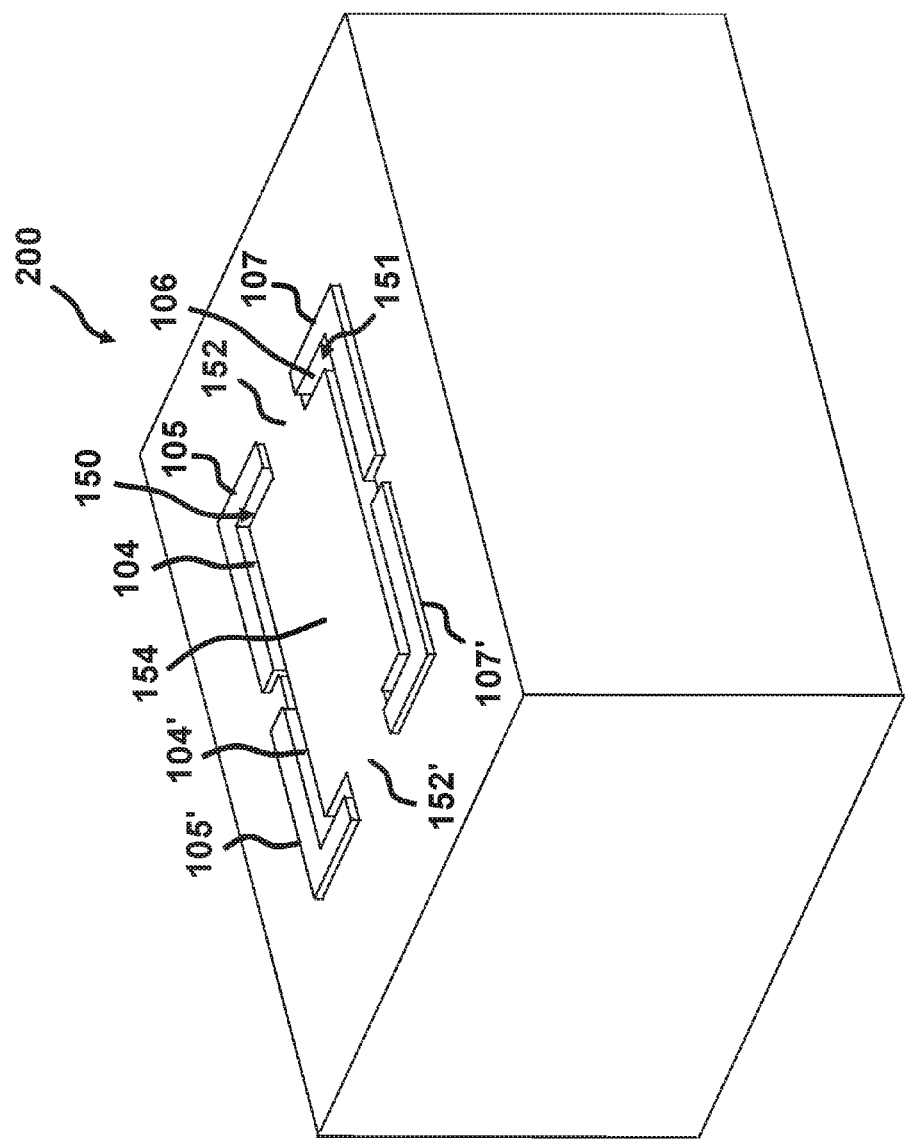
FIG. 14 depicts a schematic of a partial view of two exemplary chip modules of an exemplary multilayer substrate panel.

Referring now to FIG. 14, a schematic of a partial view of an exemplary multilayer substrate panel 200 is shown, according to an embodiment of the present invention. The part of the substrate panel 200 shown includes structures of two chip modules arranged symmetrically to each other. The remaining part 154 for providing recesses 102, 102' may be arranged within the multilayer substrate panel 200. The two trenches 150, 151 may be provided which are assigned to both chip modules. Furthermore, plating and etching of the metal features 105, 107 and metal features 105', 107' on a top surface of the substrate panel 200, as well as within the two trenches 150, 151, may be provided. In each of the two trenches 150, 151, the first, second platings 104, 106, the metal features 105, 107, 105', 107', assigned to different chip modules may be arranged separately from each other. According to an alternative embodiment, the two trenches 150, 151, the first, second platings 104, 106, the metal features 105, 107, 105', 107', are provided as common conductive structures, which are split, when the chip modules are separated from each other. Also shown is the linking portion 152, and a linking portion 152.

Figure 15:
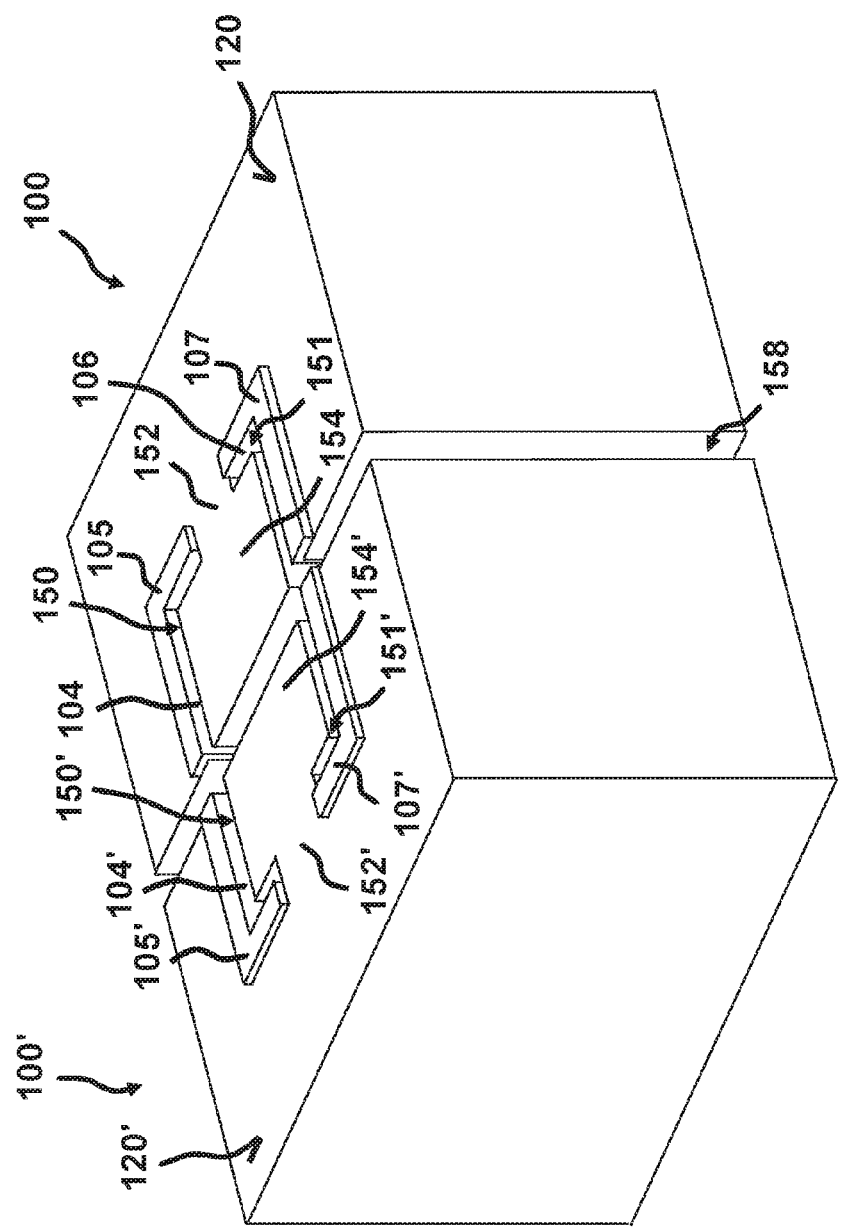
FIG. 15 depicts a schematic of the partial view of FIG. 14 after separation of the two exemplary chip modules.

Referring now to FIG. 15, a schematic of the partial view of two exemplary chip modules of an exemplary multilayer substrate panel is shown. An exemplary cut 158 is illustrated in FIG. 15. The chip module 100 may be separated from a second chip module 100', e.g. after applying the first and second platings 104, 106 to the respective chip modules by cutting through the multilayer substrate panel 200 of FIG. 14, along boundaries of the chip module 100 and the second chip module 100'.

Also shown is the first, second platings 104, 106, the metal features 105, 107, the top surface 120, the two trenches 150, 151, the linking portion 152, and the remaining part 154, all of the chip module 100. Also shown is the third plating 104', the metal features 105', 107', a top surface 120', two trenches 150', 151', a linking portion 152', and a remaining part 154', all of the second chip module 100'.

Figure 16:
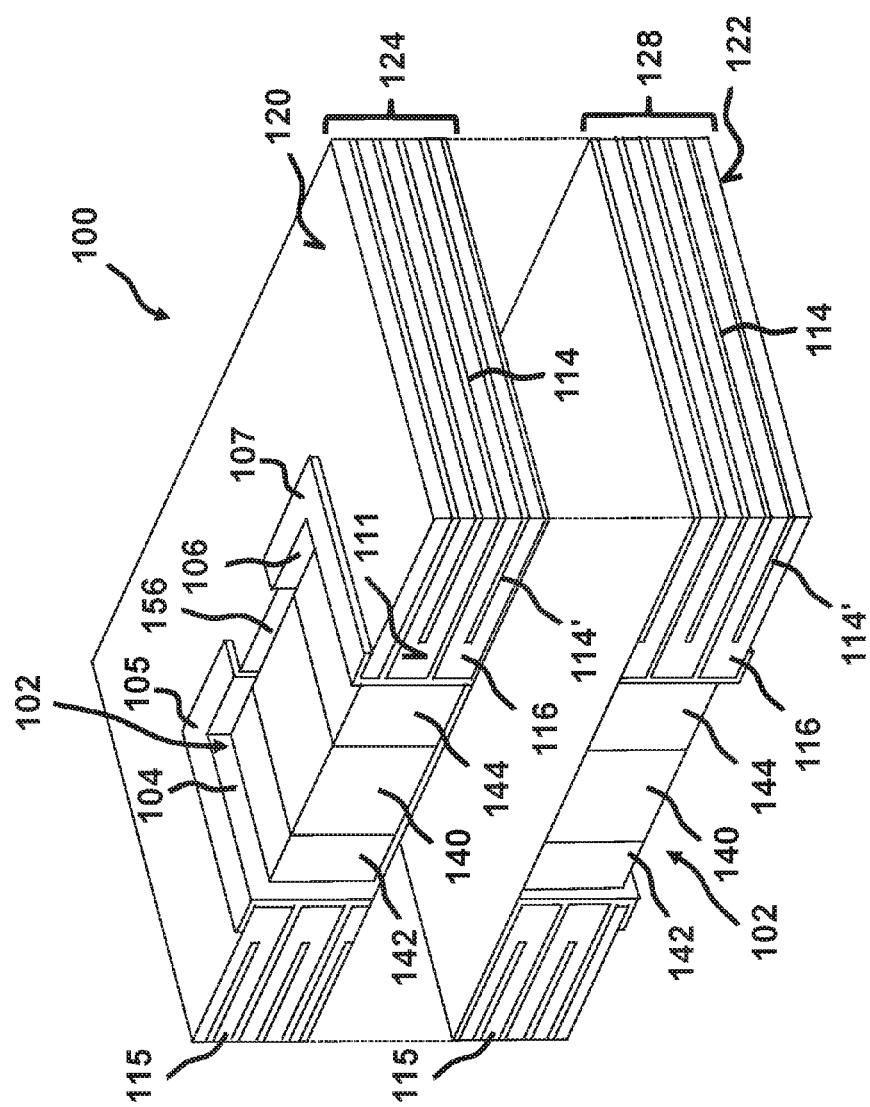
FIG. 16 depicts a schematic of the partial view of a chip module with two recesses each provided with a discrete electronic device.

Referring now to FIG. 16, a schematic of the partial view of a chip module 100 with two recesses 102, each provided with a discrete electronic device 140, is shown, according to an embodiment of the present invention. The two recesses 102 may, for example, be provided at the edge of the top surface 120 as well as at the edge of the bottom surface 122. A structure of an upper part of the chip module 100 next to the top surface 120 may be provided in the form of the upper set 124 of thin-film layers, while a structure of a lower part of the chip module 100 may be provided in the form of the lower set 128 of thin-film layers. The structure of the upper part as well as the structure of the lower part may be analogous to FIG. 14. Thus, a number of embedded discrete electronic device 140 may be increased.

Also shown is the first, second platings 104, 106, the metal features 105, 107, the front face 111, the first electrically conductive structure 114', the second electrically conductive structure 114, the horizontal electrically non-conductive layer 115, the clearance 116, and the first and the second electrical contact 142, 144.

Referring now to FIG. 17A to 17E, schematics of cross-sections through exemplary discrete electronic devices to be embedded in chip modules using the present method is shown, according to an embodiment of the present invention. FIG. 17A to 17E show exemplary electronic devices to be embedded in a chip module 100. FIG. 17A shows an electronic device in the form of an SMT capacitor 1700. FIG. 17B shows an electronic device in the form of a double capacitor 1702. FIG. 17C shows an electronic device in form of an SMT filter 1704. FIG. 17D shows an electronic device in the form of a Z-diode 1706, i.e. an active SMT component. Finally, FIG. 17E shows an electronic device in the form of an LED 1708, i.e. a further example of an active component.

Possible combinations of features described above can be the following: A method for embedding a discrete electronic device in a chip module, the chip module including a multilayer substrate with a horizontal top surface, a horizontal bottom surface and at least one vertical side surface extending peripherally between the top surface and the bottom surface, the chip module being configured to receive one or more chips to be mounted onto the top surface, the chip module further being configured to be mounted on a printed circuit board, the chip module further including a plurality of horizontal sections stacked above each other between the top surface and the bottom surface, each section including a lower and an upper horizontal electrically conductive layer, each section further including a horizontal electrically non-conductive layer arranged between the lower and the upper electrically conductive layer, each electrically conductive layer including one or more electrically conductive structures, the discrete electronic device including a first and a second electrical contact spaced apart from each other, the method including providing a recess in the side surface, the recess extending vertically within a plurality of sections, inserting the discrete electronic device into the recess, the discrete electronic device extending within a plurality of sections, establishing a first electrically conductive connection between the first electrical contact and a first electrically conductive structure, establishing a second electrically conductive connection between the second electrical contact and a second electrically conductive structure.

The method continuing, the first and second electrically conductive structure being part of the same electrically conductive layer.

The method continuing, the first electrically conductive structure being part of a first electrically conductive layer of a first one of the plurality of sections between which the discrete electronic device extends and the second electrically conductive structure being part of a second electrically conductive layer of a second one of the plurality of sections between which the discrete electronic device extends.

The method according to any of the previous items, the recess including an elongated form extending along a first longitudinal axis, the first longitudinal axis extending along the side surface, the discrete electronic device including an elongated form extending along a second longitudinal axis, the discrete electronic device being inserted into the recess such that the second longitudinal axis extents parallel to the first longitudinal axis.

The method continuing, the first longitudinal axis extending vertically along the side surface.

The method continuing, the first longitudinal axis extending horizontally along the side surface.

The method according to any of the previous items, the recess extending at least into the top surface or at least into the bottom surface.

The method according to any of the previous items, the longitudinal discrete electronic device including a first and a second end, the first electrical contact being located at the first end and the second electrical contact being located at the second end.

The method according to any of the previous items, the method further including adding a first and a second electrically conductive plating spaced apart from each other onto an inner surface of the recess such that the first plating provides an electrically conductive connection for the first electrical contact at least to the first electrically conductive structure and the second plating provides an electrically conductive connection for the second electrical contact at least to the second electrically conductive structure.

The method continuing, the first and the second electrically conductive plating each extending vertically over a plurality of sections, the first plating providing electrically conductive connections for the first electrical contact to a first set of electrically conductive layers and the second plating providing electrically conductive connections for the second electrical contact to a second set of electrically conductive layers.

The method continuing, the first electrically conductive plating fully covering a first portion of the inner surface of the recess which the first electrical contact is facing, when being located at a predefined position within the recess, and the second electrically conductive plating fully covering a second portion of the inner surface of the recess which the second electrical contact is facing, when being located at a predefined position within the recess.

The method according to any of the previous items, the recess being provided in a predefined portion of the chip module, the predefined portion extending vertically through a plurality of electrically conductive layers, each one of the respective electrically conductive layers which is not intended to be provided with an electrically conductive connection to the discrete electronic device includes a clearance filled with an electrically non-conductive fill material, such that the respective clearance provides an insulation between the respective layer and the recess provided at the predefined portion.

The method according to any of the previous items, the chip module including a plurality of vertical ground vias distributed peripherally around the predefined location.

The method according to any of the previous items, the method further includes providing at least two spaced apart recesses located vertically above each other, the upper one of the respective recesses extending into the top surface, the lower one of the respective recesses extending into the bottom surface.

The method according to any of the previous items, the method further includes providing a plurality of recesses peripherally distributed around the chip module in one or more side surfaces of the chip module and adding a first and a second electrically conductive plating to each recess such that the electrically conductive plated recesses form a fence peripherally arranged around the chip module, the fence providing a shielding against emission of electromagnetic energy by the chip module.

The method according to any of the previous items, the discrete electronic device including a third electrical contact arranged between the first and second electrical contact, the method further including adding a third electrically conductive plating spaced apart from the first and the second electrically conductive plating onto an inner surface of the recess, establishing a third electrically conductive connection between the third electrical contact and a third electrically conductive structure via the third plating, the third electrically conductive structure being arranged between the first and second electrically conductive structure.

The method according to any of the previous items, the discrete electronic device being a capacitor, a resistor, an inductor, a filter or an active component.

A chip module with a discrete electronic device embedded therein, the chip module including a multilayer substrate with a horizontal top surface, a horizontal bottom surface and at least one vertical side surface extending peripherally between the top surface and the bottom surface, the chip module being configured to receive one or more chips to be mounted onto the top surface, the chip module further being configured to be mounted on a printed circuit board, a plurality of horizontal sections stacked above each other between the top surface and the bottom surface, each section including a lower and an upper horizontal electrically conductive layer, each section further including a horizontal electrically non-conductive layer arranged between the lower and the upper electrically conductive layer, each electrically conductive layer including one or more electrically conductive structures, the discrete electronic device including a first and a second electrical contact spaced apart from each other, a recess in the side surface, the recess extending vertically within a plurality of sections, the discrete electronic device being located in the recess, the discrete electronic device extending within a plurality of sections, a first electrically conductive connection between the first electrical contact and a first electrically conductive structure, a second electrically conductive connection between the second electrical contact and a second electrically conductive structure.

A method for embedding a discrete electronic device in a chip module, the chip module including a multilayer substrate with a horizontal top surface, a horizontal bottom surface and at least one vertical side surface extending peripherally between the top surface and the bottom surface, the chip module being configured to receive one or more chips to be mounted onto the top surface, the chip module further being configured to be mounted on a printed circuit board, the chip module further including a plurality of horizontal electrically conductive layers with adjacent electrically conductive layer being separated from each other by a horizontal electrically non-conductive layer, the chip module further including a predefined electrically non-conductive portion for embedding a discrete electronic device, the predefined portion being located at the side surface and extending vertically through a plurality of electrically conductive layers, the discrete electronic device including a first and a second electrical contact spaced apart from each other, the method including providing two trenches at least in the top or bottom surface extending from the side surface along a circumferential boundary of the predefined portion into the respective top or bottom surface, such that a linking portion remains between the two trenches connecting the predefined portion with the rest of the substrate, applying a first plating to the surfaces of an outer sidewall of the first trench, applying a second plating to the surfaces of an outer sidewall of the second trench, removing the linking portion, removing the remaining part of the predefined portion extending between the two trenches such that a recess for receiving the discrete electronic device is provided in the side surface, the recess extending along a peripheral edge of the top surface, inserting the discrete electronic device into the recess, establishing a first electrically conductive connection between the first electrical contact and a first electrically conductive structure via a first plating, establishing a second electrically conductive connection between the second electrical contact and a second electrically conductive structure via a second plating.

The method continuing, electrically conductive layers of a first set of the electrically conductive layers each including an electrically non-conductive clearance along a first part of the circumferential boundary of a predefined portion along which the first trench is provided, while the electrically conductive layers of the respective first set each includes an electrically conductive structure reaching to a second part of a circumferential boundary of the predefined portion along which the second trench is provided, electrically conductive layers of a second set of the electrically conductive layers each includes an electrically non-conductive clearance along the second part of the circumferential boundary of the predefined portion, while the electrically conductive layers of the respective second set each includes an electrically conductive structure reaching to the first part of the circumferential boundary of the predefined portion.

The method continuing, the first electrically conductive connection connecting the first electrical contact with the electrically conductive structures of the electrically conductive layers of the first set of the electrically conductive layers, the second electrically conductive connection connecting the second electrical contact with the electrically conductive structures of the electrically conductive layers of the second set of the electrically conductive layers.

The method continuing, the chip module including a plurality of predefined electrically non-conductive portions for embedding a plurality of a discrete electronic device peripherally distributed around the chip module.

The method continuing, the chip module being part of a multilayer substrate panel including a plurality of chip modules, the method further includes separating the individual chip modules from each other after applying the first and second platings to the respective chip modules.

A chip module configured for embedding a plurality of discrete electronic devices therein, the discrete electronic devices being peripherally distributed around the chip module, the chip module including a multilayer substrate with a horizontal top surface, a horizontal bottom surface and one or more vertical side surfaces extending peripherally between the top surface and the bottom surface, the chip module being configured to receive one or more chips to be mounted onto the top surface, the chip module further being configured to be mounted on a printed circuit board, a plurality of horizontal electrically conductive layers with adjacent electrically conductive layer being separated from each other by a horizontal electrically non-conductive layer, a plurality of predefined electrically non-conductive portions for embedding a discrete electronic device, each of the predefined portions being located at one of the side surfaces and extending vertically through a plurality of electrically conductive layers, the predefined portions being peripherally distributed around the chip module, for each predefined portion a first one of the electrically conductive layers includes an electrically non-conductive clearance along a first part of a circumferential boundary of the respective predefined portion and an electrically conductive structure reaching to a second part of the circumferential boundary of the respective predefined portion, for each predefined portion a second one of the electrically conductive layers includes an electrically non-conductive clearance along the second part of the circumferential boundary of the respective predefined portion and an electrically conductive structure reaching to the first part of the circumferential boundary of the respective predefined portion, the size of each predefined portion being configured to be provided with a recess for receiving a discrete electronic device including a first and a second electrical contact spaced apart from each other such that a first electrically conductive connection is established between the first electrical contact and the electrically conductive structure of the first electrically conductive layer and such that a second electrically conductive connection is established between the second electrical contact and the electrically conductive structure of the second electrically conductive layer.

A multilayer substrate panel for manufacturing a plurality of chip modules with a plurality of discrete electronic devices embedded therein, the discrete electronic devices being peripherally distributed around each one of the chip modules, the panel including a plurality of chip modules, each chip module including a part of the multilayer substrate panel with a horizontal top surface, a horizontal bottom surface and one or more vertical side surfaces extending peripherally between the top surface and the bottom surface, the chip module being configured to receive one or more chips to be mounted onto the top surface, the chip module further being configured to be mounted on a printed circuit board, a plurality of horizontal electrically conductive layers with adjacent electrically conductive layer being separated from each other by a horizontal electrically non-conductive layer, a plurality of predefined electrically non-conductive portions for embedding a discrete electronic device, each of the predefined portions being located one of the side surfaces and extending vertically through a plurality of electrically conductive layers, the predefined portions being peripherally distributed around the chip module, for each predefined portion a first one of the electrically conductive layers includes an electrically non-conductive clearance along a first part of a circumferential boundary of the respective predefined portion and an electrically conductive structure reaching to a second part of the circumferential boundary of the respective predefined portion, for each predefined portion a second one of the electrically conductive layers includes an electrically non-conductive clearance along the second part of the circumferential boundary of the respective predefined portion and an electrically conductive structure reaching to the first part of the circumferential boundary of the respective predefined portion, the size of each predefined portion being configured to be provided with a recess for receiving a discrete electronic device including a first and a second electrical contact spaced apart from each other such that a first electrically conductive connection is established between the first electrical contact and the electrically conductive structure of the first electrically conductive layer and such that a second electrically conductive connection is established between the second electrical contact and the electrically conductive structure of the second electrically conductive layer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for embedding a discrete electronic device in a chip module, the method comprising:
   providing the chip module comprising a multilayer substrate with a horizontal top surface, a horizontal bottom surface and at least one vertical side surface extending peripherally between the horizontal top surface and the horizontal bottom surface;
   configuring the chip module to receive one or more discrete electronic devices to be mounted onto the horizontal top surface, the chip module configured to be mounted on a printed circuit board,
   the chip module comprising a plurality of horizontal electrically conductive layers each separated by a horizontal electrically non-conductive layer, each of the plurality of horizontal electrically conductive layers comprising one or more electrically conductive structures,
   the chip module further comprising a predefined electrically non-conductive portion for embedding a first device of the one or more discrete electronic devices, the predefined electrically non-conductive portion located at the vertical side surface and extending vertically through a first plurality of the plurality of horizontal electrically conductive layers,
   the first device comprising a first electrical contact and a second electrical contact spaced apart from each other;
   providing a first trench and a second trench at least one of the horizontal top surface and the horizontal bottom surface, the first trench and the second trench each extending from the vertical side surface along a circumferential boundary of the predefined electrically non-conductive portion into the at least one of the horizontal top surface and the horizontal bottom surface, such that a linking portion remains between the first trench and the second trench connecting the predefined electrically non-conductive portion with a remainder of the multilayer substrate;
   applying a first plating to a surface of an outer sidewall of the first trench;
   applying a second plating to a surface of an outer sidewall of the second trench;
   removing the linking portion;
   removing a remaining portion of the predefined electrically non-conductive portion extending between the first trench and the second trench such that a recess for receiving the first device is provided in the vertical side surface, the recess extending along a peripheral edge of the horizontal top surface;
   inserting the first device into the recess;
   electrically connecting the first electrical contact and a first electrically conductive structure of the one or more electrically conductive structures; and
   electrically connecting the second electrical contact and a second electrically conductive structure of the one or more electrically conductive structures via a second plating.

2. The method according to claim 1,
   wherein a first set of layers of the plurality of horizontal electrically conductive layers each comprise both a first electrically non-conductive clearance along a first portion of the circumferential boundary of the predefined electrically non-conductive portion along which the first trench is provided, and an electrically conductive structure electrically connected to a second portion of the circumferential boundary of the predefined electrically non-conductive portion along which the second trench is provided, and
   wherein a second set of layers of the plurality of horizontal electrically conductive layers each comprise a second electrically non-conductive clearance along the second portion of the circumferential boundary of the predefined portion, wherein the second set of layers each comprise an electrically conductive structure electrically connected to the first portion of the circumferential boundary of the predefined electrically non-conductive portion.

3. The method according to claim 2, further comprising:
electrically connecting the first electrical contact and the one or more electrically conductive structures of the first set of layers of the plurality of horizontal electrically conductive layers; and
electrically connecting the second electrical contact and the one or more electrically conductive structures of the second set of layers of the plurality of horizontal electrically conductive layers.

4. The method according to claim 1, wherein the chip module comprises one or more predefined electrically non-conductive portions for embedding one or more discrete electronic devices peripherally distributed around the chip module.

5. The method according to claim 1, wherein a multilayer substrate panel comprises one or more chip modules, the method further comprising:
electrically separating the one or more chip modules from each other.

6. The method according to claim 1, the method further comprising:
adding a first and a second electrically conductive plating, the first and the second electrically conductive plating spaced apart from each other onto an inner surface of the recess, such that the first plating provides an electrically conductive connection for the first electrical contact, and the second plating provides an electrically conductive connection for the second electrical contact.

7. The method according to claim 6, wherein the first and the second electrically conductive plating each extending vertically over a plurality of horizontal sections, the first plating providing electrically conductive connections for the first electrical contact to a first set of the lower and upper horizontal electrically conductive layers and the second plating providing electrically conductive connections for the second electrical contact to a second set of the lower and upper horizontal electrically conductive layers.

8. The method according to claim 7, the first electrically conductive plating fully covering a first portion of the inner surface of the recess which the first electrical contact is facing, when being located at a first predefined position within the recess, and the second electrically conductive plating fully covering a second portion of the inner surface of the recess which the second electrical contact is facing, when being located at a second predefined position within the recess.

9. The method according to claim 1, the recess being provided in a predefined portion of the chip module, the predefined portion extending vertically through a plurality of the lower and upper horizontally electrically conductive layers, each one of the respective plurality of the lower and the upper horizontally electrically conductive layers which is not intended to be provided with an electrically conductive connection to the discrete electronic device includes a clearance filled with an electrically non-conductive fill material, such that the respective clearance provides an insulation between the respective layer and the recess provided at the predefined portion.

10. The method according to claim 9, the chip module comprising a plurality of vertical ground vias distributed peripherally around the predefined portion.

11. A chip module to be mounted on a printed circuit board, the chip module comprising:

a multilayer substrate with a horizontal top surface, a horizontal bottom surface and one or more vertical side surfaces extending peripherally between the top surface and the bottom surface;
the chip module configured to embed one or more discrete electronic devices, the one or more discrete electronic devices to be peripherally distributed around the horizontal top surface;
one or more horizontal electrically conductive layers separated by a horizontal electrically non-conductive layer; and
one or more predefined electrically non-conductive portions for embedding the one or more discrete electronic devices, each of the one or more predefined electrically non-conductive portions located at least one of the one or more vertical side surfaces and extending vertically through a plurality of the one or more horizontal electrically conductive layers, the predefined electrically non-conductive portions peripherally distributed around the chip module,
wherein each of the one or more predefined electrically non-conductive portions comprises a first layer of the one or more horizontal electrically conductive layers, and a second layer of the one or more horizontal electrically conductive layers, wherein
the first layer comprises both an electrically non-conductive clearance along a first portion of a circumferential boundary of the respective predefined electrically non-conductive portion, and a first electrically conductive structure electrically connected to a second portion of the circumferential boundary of the respective predefined electrically non-conductive portion,
the second layer comprises both an electrically non-conductive clearance along the second portion of the circumferential boundary of the respective predefined electrically non-conductive portion, and a second electrically conductive structure electrically connected to the first portion of the circumferential boundary of the respective predefined electrically non-conductive portion, and
a size of each of the one or more predefined electrically non-conductive portions configured to be provided with a recess for receiving a discrete electronic device of the one or more discrete electronic devices, the discrete electronic device comprising a first and a second electrical contact spaced apart from each other, wherein a first electrically conductive connection is established between the first electrical contact and the electrically conductive structure of the first layer, and a second electrically conductive connection is established between the second electrical contact and the electrically conductive structure of the second layer.

12. The chip module according to claim 11, further comprising:
a first set of layers of the plurality of horizontal electrically conductive layers each comprising both a first electrically non-conductive clearance along a first portion of the circumferential boundary of the predefined electrically non-conductive portion along which a first trench is provided, and an electrically conductive structure electrically connected to a second portion of the circumferential boundary of the predefined electrically non-conductive portion along which a second trench is provided; and a second set of layers of the plurality of horizontal electrically conductive layers each comprise a second electrically non-conductive clearance along the second portion of the circumferential boundary of the predefined portion, wherein the second set of layers each comprise an electrically conductive structure electrically connected to the first portion of the circumferential boundary of the predefined electrically non-conductive portion.

13. The chip module according to claim 12, further comprising:
    an electrical connection between the first electrical contact and the one or more electrically conductive structures of the first set of layers of the plurality of horizontal electrically conductive layers; and
    an electrical connection between the second electrical contact and the one or more electrically conductive structures of the second set of layers of the plurality of horizontal electrically conductive layers.

14. The chip module according to claim 11, wherein the chip module comprises one or more predefined electrically non-conductive portions for embedding one or more discrete electronic devices peripherally distributed around the chip module.

15. The chip module according to claim 11, wherein a multilayer substrate panel comprises one or more chip modules, further comprising:
    electrically separating the one or more chip modules from each other.

16. The chip module according to claim 11, further comprising:
    a first and a second electrically conductive plating, the first and the second electrically conductive plating spaced apart from each other onto an inner surface of the recess, such that the first plating provides an electrically conductive connection for the first electrical contact, and the second plating provides an electrically conductive connection for the second electrical contact.

17. The chip module according to claim 16, wherein the first and the second electrically conductive plating each extending vertically over a plurality of horizontal sections, the first plating providing electrically conductive connections for the first electrical contact to a first set of the lower and upper horizontal electrically conductive layers and the second plating providing electrically conductive connections for the second electrical contact to a second set of the lower and upper horizontal electrically conductive layers.

18. The chip module according to claim 17, the first electrically conductive plating fully covering a first portion of the inner surface of the recess which the first electrical contact is facing, when being located at a first predefined position within the recess, and the second electrically conductive plating fully covering a second portion of the inner surface of the recess which the second electrical contact is facing, when being located at a second predefined position within the recess.

19. The chip module according to claim 11, the recess being provided in a predefined portion of the chip module, the predefined portion extending vertically through a plurality of the lower and upper horizontally electrically conductive layers, each one of the respective plurality of the lower and the upper horizontally electrically conductive layers which is not intended to be provided with an electrically conductive connection to the discrete electronic device includes a clearance filled with an electrically non-conductive fill material, such that the respective clearance provides an insulation between the respective layer and the recess provided at the predefined portion.

20. The chip module chip module according to claim 19, comprising a plurality of vertical ground vias distributed peripherally around the predefined portion.

* * * * *